(12) United States Patent
Ueno

(10) Patent No.: US 6,337,762 B1
(45) Date of Patent: Jan. 8, 2002

(54) ALL-OPTICAL SWITCH AND WAVELENGTH CONVERTER

(75) Inventor: Yoshiyasu Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/353,317

(22) Filed: Jul. 14, 1999

(30) Foreign Application Priority Data

Jul. 14, 1998 (JP) .......................................... 10-198744

(51) Int. Cl.$^7$ .............................................. G02F 1/365
(52) U.S. Cl. ............................ 359/332; 385/1; 385/14; 385/16
(58) Field of Search ................................ 359/326–332; 385/1–3, 14–16

(56) References Cited

U.S. PATENT DOCUMENTS 5,978,129 A * 11/1999 Jourdan et al. ............. 359/326

FOREIGN PATENT DOCUMENTS

| JP | 7-20510 | 1/1995 |
| JP | 8-18539 | * 1/1996 |
| JP | 8-179385 | 7/1996 |
| JP | 8-334796 | 12/1996 |
| JP | 10-301151 | 11/1998 |

OTHER PUBLICATIONS

Patel et al. "40–Gb/s Demultiplexing Using an Ultrafast Nonlinear Interferometer (UNI)," IEEE Photonics Technology Letters, vol. 8, No. 12, Dec. 1996 pp. 1695–1697.

Sokoloff et al. "Demostration of all–optical demultiplexing of TDM data at 250 Gbit/s" Electronics Letters, Feb. 17th 1994 vol. 30 No. 4 pp. 339–341.

Tajima K., "All–optical switch–off time unrestricted by carrier lifetime," Jpn. J. Appl. Phys. vol. 32 (1993) pp. K1746–1749, Dec. 1993.

Nakamura, et al. "Untrafast polarization–discriminating Mach–Zehnder all–optical switch," Appl. Phys. Lett. 67 (25), Dec. 18, 1995 pp. 3709–3711.

Nakamura, et al. "Experimenting investment on high–speed switching characteristics of a novel symmetric Mach–Zehnder all–optical switch," Appl. Phys. Lett. 65(3), Jul. 18, 1994 pp. 283–285.

Ueno, et al. "3.8–THz Wavelength Conversion of Picosecond Pulses Using a Semiconductor Delayed–Interference Signal–Wavelength Converter (DISC)", IEEE Photonics Technology Letters, vol. 10, No. 3, Mar. 1998 pp. 346–348.

Japanese Office Action dated Mar. 14, 2001 with partial English translation.

Nakamura et al., "Ultrafast and low–energy operation of symmetric Mach–Zehnder all–optical switch", Technical Report of IEICE, Sep., 1995, pp.13–18,(abstract translation in English).

* cited by examiner

*Primary Examiner*—John D. Lee
(74) *Attorney, Agent, or Firm*—McGinn & Gibb, PLLC

(57) ABSTRACT

An all-optical switch for outputting output light by transmitting/interrupting second input light with a second wavelength synchronizing with first input light with a first wavelength. The all-optical switch has: an optical interferometer to which the first and second input lights are input and which is composed of a non-linear semiconductor waveguide; a supervisory laser light source which supplies supervisory light with a third wavelength to the optical interferometer; and a controller to which supervisory light output from the optical interferometer is input as output supervisory light and which controls the phase bias of the interferometer according to the output supervisory light.

30 Claims, 19 Drawing Sheets

ALL-OPTICAL SWITCH AND WAVELENGTH CONVERTER

FIELD OF THE INVENTION

This invention relates to an optical switch and a wavelength converter used for optical communications or optical information processing, and more particularly to, an optical switch and a wavelength converter used for TDM (time division multiplexing) optical communications.

BACKGROUND OF THE INVENTION

A so-called all-optional switch and a wavelength converter are known generally. Using these optical switch and wavelength converter, very fast optical communications can be realized.

A known example of such an optical switch is a symmetrical Mach-Zehnder type all-optical switch (hereinafter referred to as 'prior art 1') disclosed in Japanese patent application laid-open No.7-20510 (1995) and Japanese Journal of Applied Physics, vol.32, pp.1746–1749, 1993. Although this optical switch is intended as a TDM demultiplexer, it can also generate optical pulse with a wavelength different from that of input pulse (Applied Physics Letters, vol.65, pp.283–285, 1994). Therefore, it can also function as a wavelength converter.

A further known example is a high-stability polarization separation type all-optical switch (hereinafter referred to as 'prior art 2'), which is a modification of prior art 1 above, disclosed in Japanese patent application laid-open No.8-179385 (1996) and Applied Physics Letters, vol.67, pp.3709–3711, 1995. Also, another example of a polarization separation type all-optical switch, which operates in mechanism similar to that of prior art 2, is reported in IEEE Photonics Technology Letters, vol.8, pp.1695–1697, 1996. These polarization separation type optical switches can also function as a wavelength converter.

On the other hand, an all-optical switch (hereinafter referred to as 'prior art 3') that a Mach-Zehnder type interferometer is replaced by a combination of Sagnac type interferometer and semiconductor optical amplifier is reported in Electronics Letters, vol.30, pp.339–341, 1994. In this prior art 3, the operational principle is analogous to those in prior arts 1 and 2 and the operation can be conducted as fast as that in prior arts 1 and 2.

Further, a DISC type wavelength converter (hereinafter referred to as 'prior art 4') that the structure of the all-optical switch in prior art 2 is simplified is disclosed in Japanese patent application No.09-111633 (1997) and IEEE Photonics Technology Letters, vol.10, pp.346–348, 1998.

In prior arts 1 to 3, the all-optical switches extract optical signal from Return-to-Zero (RZ) optical signal sequence at intervals of certain time (TDM demultiplexer). The timing of extraction is controlled by control optical pulse that is input to the all-optical switch, with RZ optical signal sequence. By these all-optical switches, ultra-high-speed RZ optical signal sequence with a signal interval much shorter than carrier lifetime in the non-linear semiconductor waveguide or semiconductor optical amplifier can be demultiplexed. Meanwhile, the carrier lifetime in semiconductor is as long as 100 ps to 10 ns.

In converting the wavelength of RZ optical signal by using the all-optical switch described in prior arts 1 to 3, RZ optical signal sequence with a wavelength of $\lambda 1$ is input to the input port of control optical pulse of the all-optical switch, and continuous light with a wavelength of $\lambda 2$ is input to the input port of optical signal. Thereby, according to the existence of input RZ optical signal pulse, the all-optical switch opens and then shuts automatically after a given time. Thus, according to the existence of input RZ optical signal pulse, continuous light with a wavelength of $\lambda 2$ turns on and then turns off automatically after a given time, being output as RZ optical signal with a wavelength of $\lambda 2$ (these operations are explained in detail later). Meanwhile, the device in prior art 4 functions only an a wavelength converter of RZ optical signal. In using them as a wavelength converter, they can output optical pulse shorter than the carrier lifetime in the non-linear semiconductor waveguide or semiconductor optical amplifier.

Here, as one example of the conventional all-optical switches, the all-optical switch in prior art 1 will be explained referring to the drawings.

Referring to FIG. 1, the all-optical switch is provided with semiconductor waveguides 10, 11, a first input port 12 to which control optical pulse is input, a second input port to which signal optical pulse is input, and signal output ports 22, 23.

Control optical pulse (wavelength $\lambda 1$) input to the input port 12 is divided into 50:50, which correspond to first and second control optical pulses, at a branch point 13. The first control optical pulse is led through a coupling point 16 to a semiconductor waveguide 10. On the other hand, the second control optical pulse is led through a coupling point 17 to a semiconductor waveguide 11. Here, the optical path length from the branch point 13 to the semiconductor waveguide 11 is longer than the optical path length from the branch point 13 to the semiconductor waveguide 10. Therefore, the time when the second control optical pulse reaches the semiconductor waveguide 11 is later than the time when the first control optical pulse reaches the semiconductor waveguide 10 (here, the delay time is represented by $\Delta t$).

When the semiconductor waveguides 10, 11 receive first and second control optical pulses, respectively, the refractive index of the semiconductor waveguides 10, 11 changes transitionally (so-called non-linear change of refractive index occurs). Such non-linear change of refractive index occurs due to the change of carrier density inside the semiconductor waveguide. Namely, the refractive index reduces as the carrier density increases, and the refractive index increases as the carrier density reduces (band filling effect).

When the semiconductor waveguides 10, 11 are semiconductor optical amplifiers, the refractive index increases for a certain period and then recovers. The period when the refractive index increases is nearly equal to the pulse width of control optical pulse. On the other hand, the time constant in recovery of refractive index is equal to the carrier lifetime in the semiconductor optical amplifier.

When the semiconductor waveguides are absorption-type semiconductor waveguides, the refractive index reduces for a certain period and then recovers. The period when the refractive index reduces is nearly equal to the pulse width of control optical pulse, and the time constant in recovery of refractive index is equal to the carrier lifetime in the semiconductor waveguide.

Signal optical pulse (wavelength $\lambda 2$) input to the input port 18 is divided into 50:50, which correspond to first and second signal optical pulses, at a branch point 19. The first signal optical pulse is led through the coupling point 16 and the semiconductor waveguide 10 to a coupling point 20. On the other hand, the second signal optical pulse is led through the coupling point 17, the semiconductor waveguide 11 and a phase adjuster 26 to the coupling point 20.

The first and second signal optical pulses are coupled at the coupling point 20, where interference will occur. Namely, interference light occurs. This interference light is divided into 50:50, which correspond to first and second interference lights, at a branch point 21. The first interference light is led though a wavelength filter 24 to the output port 22, and the second interference light is led through a wavelength filter 25 to the output port 23.

Meanwhile, the optical path extending from the branch point 19 through the semiconductor waveguide 10 to the coupling point 20, and the optical path extending from the branch point 19 through the semiconductor waveguide 11 and the phase adjuster 26 to the coupling point 20 compose a so-called Mach-Zehnder type interferometer. Here, the optical paths are adjusted so that the optical path length of the arm extending from the branch point 19 through the semiconductor waveguide 10 to the coupling point 20 is equal to the optical path length of the arm extending from the branch point 19 through the branch point 17, the semiconductor waveguide 11 and the phase adjuster 26 to the coupling point 20.

As described earlier, the refractive index of the semiconductor waveguides 10, 11 changes due to the control optical pulse, therefore the phase of signal optical pulse to pass through the semiconductor waveguides 10, 11 changes transitionally (so-called non-linear phase shift). Here, FIG. 2A shows an example of phase shift of signal optical pulse. In FIG. 2A, the width of control optical pulse is 2 ps, Δt is 25 ps, the interval of switch operation time (interval of control optical pulse) is 1 ns, and the carrier lifetime is 10 ns.

Here, provided that electric field of input signal optical pulse is $E_{IN}(t)$, electric field of signal optical pulse (component A, first signal optical pulse) transmitted through the semiconductor waveguide 10 is $E_A(t)$, and electric field of signal optical pulse (component B, second signal optical pulse) transmitted through the semiconductor waveguide 11 is $E_B(t)$, equations (1) and (2) below are given.

$$E_A(t) = \frac{1}{2} E_{IN}(t) \cdot \exp[i\Phi_A(t)] \qquad (1)$$

$$E_B(t) = \frac{1}{2} E_{IN}(t) \cdot \exp[i\Phi_B(t)] \qquad (2)$$

In FIG. 2A, the solid curve indicates the phase change $\Phi_A(t)$ of component A, and the dotted curve indicates the phase change $\Phi_B(t)$ of component B (operational example 1). Meanwhile, the semiconductor waveguide is of a semiconductor optical amplifier.

When the refractive index of the semiconductor optical amplifier changes by arrival of one control optical pulse, the phase of the signal optical pulse increases. The amount of phase increase of component B is equal to the amount of phase increase of component A. When the refractive index of the semiconductor optical amplifier recovers, the phase of signal light also recovers. The refractive index change of the semiconductor optical amplifier 11 is Δt later than that of the semiconductor optical amplifier 10. Therefore, the phase change of second signal optical pulse (component B) is Δt later than that of the phase change of second signal optical pulse (component A). Accordingly, equation (3) below is established.

$$\Phi_A(t) = \Phi_B(t+\Delta t) + \Phi_b \qquad (3)$$

Meanwhile, the amount of non-linear phase shift of the semiconductor waveguide 11 is made equal to that of the semiconductor waveguide 10. Here, the phase bias $\Phi_b$ is adjusted by the phase adjuster 26.

After components A, B are coupled at the coupling point 20 to generate interference light, electric field of interference light (component P, first interference light) reaching the output port 22 is given by:

$$E_P(t) = E_A(t) + E_B(t) \qquad (4)$$

In contrast to this, electric field of interference light (component Q, second interference light) reaching the output port 23 is given by:

$$E_Q(t) = E_A(t) + E_B(t) \cdot \exp[i\pi] \qquad (5)$$
$$= E_A(t) - E_B(t)$$

Which is the compensation component of component P.

From equations (1) to (5), equation (6) below is obtained.

$$\begin{aligned} E_F(t) &= \frac{1}{2} E_{IN}(t) \cdot (\exp[i\Phi_A(t)] + \exp[i\Phi_B(t)]) \\ &= \frac{1}{2} E_{IN}(t) \cdot \exp\left[i\frac{\Phi_A(t)+\Phi_B(t)}{2}\right] \cdot \\ &\quad \left(\exp\left[i\frac{\Phi_A(t)-\Phi_B(t)}{2}\right] + \exp\left[-i\frac{\Phi_A(t)-\Phi_B(t)}{2}\right]\right) \\ &= E_{IN}(t) \cdot \exp\left[i\frac{\Phi_A(t)+\Phi_B(t)}{2}\right] \cdot \cos\frac{\Phi_A(t)-\Phi_B(t)}{2} \end{aligned} \qquad (6)$$

Therefore, the complex transmittance to signal light of all-optical switch is given by:

$$\begin{aligned} T(t) &\equiv \frac{E_F(t)}{E_{IN}(t)} \\ &= \exp\left[i\frac{\Phi_A(t)+\Phi_B(t)}{2}\right] \cdot \cos\frac{\Phi_A(t)-\Phi_B(t)}{2} \end{aligned} \qquad (7)$$

The intensity transmissivity is given by:

$$|T(t)|^2 \equiv \cos^2 \frac{\Phi_A(t)-\Phi_B(t)}{2} \qquad (8)$$

In the example shown, the phase bias $\Phi_b$ (FIG. 2B) is adjusted to be:

$$\phi_b = \pi \qquad (9)$$

The phase difference $\phi_A(t)-\phi_B(t)$ is shown in FIG. 2B and the signal intensity transmittance $|T(t)|^2$ is shown in FIG. 2C. Before component A incurs non-linear phase shift ($t<t_0$= approximately 0 ps) and after component B incurs non-linear phase shift ($t<t_0+\Delta t$=approximately 25 ps), next equations are given.

$$\Phi_A(t) - \Phi_B t = \Phi_b = \pi \qquad (10)$$

$$|T(t)|^2 \equiv \cos^2 \frac{\Phi_A(t)-\Phi_B(t)}{2} = 0 \qquad (11)$$

Therefore, the transmittance of all-optical switch takes a finite value, which is not zero, only while $t_0<t<t_0+\Delta t$ is satisfied (FIG. 2C).

The condition that the all-optical switch extracts signal optical pulse from signal optical pulse sequence is illustrated in FIGS. 3A to 3E. The time when control optical pulse enters to the all-optical switch is $t_1-\Delta t/2$ (FIG. 3A). The all-optical switch transmits signal optical pulse only between $t_1-\Delta t/2$ and $t_1+\Delta t/2$ (FIG. 3B). Meanwhile, the pulse width of signal optical pulse is shorter than $\Delta t$. Thus, the all-optical switch transmits only signal optical pulse (FIG. 3D) at time $t_1$ of signal optical pulses at $t_N$ (N=-1, 0, 1, 2, . . . ) (FIG. 3C), outputting it from the output port 22. On the other hand, signal optical pulse sequence (FIG. 3E) that only the signal optical pulse at time $t_1$ of input signal optical pulses is removed is output from the output port 23.

Meanwhile, in using a semiconductor optical amplifier as the semiconductor waveguide, it is necessary to select such a wavelength of control optical pulse that control optical pulse can be amplified efficiently by the semiconductor optical amplifier. The control optical pulse amplified by the semiconductor optical amplifier is removed by the filters 24, 25. The intensity of signal optical pulse and the bandgap of active layer in the semiconductor optical amplifier need to be selected so that the carrier number change in the semiconductor optical amplifier by signal light passing through the semiconductor optical amplifier is negligibly smaller than the carrier number change by control optical pulse.

On the other hand, in using an absorption type semiconductor waveguide as the semiconductor waveguide, it is necessary to select such a wavelength of control optical pulse that control optical pulse can be absorbed efficiently by the absorption type semiconductor waveguide. Also, the bandgap of active layer of the semiconductor waveguide needs to be selected so that signal light passing through the semiconductor waveguide is not absorbed by the absorption type semiconductor waveguide. Meanwhile, in using the absorption type semiconductor waveguide, the sign of non-linear phase shift in FIG. 2A is reverse to that in using the semiconductor optical amplifier.

However, in the all-optical switch in FIG. 1, when the interval of operation time in the all-optical switch is short, i.e., when the interval of control optical pulse is short, the extinction ratio lowers. Here, an example of operation of all-optical switch that extracts 10 Gbps signal optical pulse sequence from 60 Gbps signal optical pulse sequence is shown in FIGS. 4A to 4C (operational example 2). Here, the width of control optical pulse is 2 ps, $\Delta t$ is 16.6 ps, the interval of switch operation time (interval of control optical pulse) in 100 ps, and the carrier lifetime is 500 ns. Meanwhile, $\Delta t$ is set to match with the interval of 60 Gbps signals and the interval of switch operation time is set to match with the interval of 10 Gbps signals.

As shown in the operational example 2, when the interval of operation time is short, equations 10 and 11 become inapplicable. Namely, before component A incurs non-linear phase shift ($t<t_0$) and after component B incurs non-linear phase shift ($t<t_0+\Delta t$), the phase difference $\phi_A(t)-\phi_B(t)$ shifts from $\pi$ (FIG. 4B). Therefore, even when $t<t_0$ and $t<t_0+\Delta t$, the transmittance to signal optical pulse does not lower to zero (FIG. 4C).

The condition that the all-optical switch in the operational example 2 extracts signal optical pulse from signal optical pulse sequence is illustrated in FIGS. 5A to 5E. In this example, since the transmittance to signal optical pulse does not lower to zero even when $t<t_0$ and $t<t_0+\Delta t$ (FIG. 5B), unnecessary signal optical pulse sequence leaks out of the output port 22 (FIG. 5D) and the output port (FIG. 5E) (FIG. 5D indicates the case for the output port 22 and FIG. 5E indicates the case for the output port 23). Thus, the conventional all-optical switch incurs deterioration in extinction ratio.

Here, FIGS. 6A to 6C shows an operational example (operational example 3) that 2 Gbps signal optical pulse sequence is extracted from 40 Gbps signal optical pulse sequence. Here, the width of control optical pulse is 2 ps, $\Delta t$ is 25 ps, the interval of switch operation time (interval of control optical pulse) is 500 ps, and the carrier lifetime is 75 ns.

As shown in the operational example 3, when the carrier lifetime is short, equations 10 and 11 become inapplicable. Namely, after component B incurs non-linear phase shift ($t<t_0+\Delta t$), the phase difference $\phi_A(t)-\phi_B(t)$ shifts from $\pi$ (FIG. 6B). Therefore, even when $t<t_0+\Delta t$, the transmittance to signal optical pulse does not lower to zero (FIG. 6C).

Thus, even when extracting signal optical pulse sequence using the all-optical switch in the operational example 3, deterioration in extinction ratio occurs like the case in FIGS. 5A to 5E.

As seen from the explanation above, in using the all-optical switches in prior arts 1 to 3 an a TDM demultiplexer, when the interval of switch operation time and the carrier lifetime are sufficiently longer than the width of switch-on time, the extinction ratio is little deteriorated. However, when the interval of switch operation time (or the carrier lifetime) comes close to the width of switch-on time, the extinction ratio deteriorates gradually.

On the other hand, in using the all-optical switches in prior arts 1 to 3 as a wavelength converter and in case of the wavelength converter in prior art 4, when the interval of optical signal and the carrier lifetime are sufficiently longer than the width of switch-on time, the extinction ratio is little deteriorated. However, when the interval of optical signal (or the carrier lifetime) comes close to the width of optical signal pulse, the extinction ratio deteriorates gradually.

Thus, when the interval of switch operation time of all-optical switch (or the carrier lifetime in semiconductor waveguide composing part of the all-optical switch) is short, there is the problem that the extinction ratio of all-optical switch deteriorates. Also, when wavelength conversion is conducted using the all-optical switch, there is a problem that the extinction ratio of output optical signal deteriorates.

Further, in prior arts 1 to 4, the all-optical switch is adjusted optimum when it stops, and to adjust the all-optical switch in operation is not considered. Namely, when it continues operating for a long time such as tens to multi-thousand hours, due to a slight change of refractive index of optical waveguide in the all-optical switch, the optimized operation conditions may drift. Therefore, it is necessary to retain the optimized operation conditions of all-optical switch in operation.

SUMMARY OF THE INVENTION

Accordingly, it is an object of the invention to provide an all-optical switch or a wavelength converter that the extinction ratio can be improved.

It is a further object of the invention to provide an all-optical switch or a wavelength converter that the limit of switch operation repetition frequency can be improved.

It is a still further object of the invention to provide an all-optical switch or a wavelength converter that the optimum operational state can be kept.

According to the invention, an all-optical switch for outputting output light by transmitting/interrupting second input light with a second wavelength synchronizing with first input light with a first wavelength, comprises:

an optical interferometer to which the first and second input lights are input and which is composed of a non-linear semiconductor waveguide;

a supervisory laser light source which supplies supervisory light with a third wavelength to the optical interferometer; and a control means to which supervisory light output from the optical interferometer is input as output supervisory light and which controls the phase bias of the interferometer according to the output supervisory light.

According to another aspect of the invention, an all-optical switch for outputting output light by transmitting/interrupting second input light with a second wavelength synchronizing with first input light with a first wavelength, comprises:

an adjusting means which adjusts the optical intensity of the first input light to give adjusted input light;

an optical interferometer to which the first and second input lights are input and which is composed of a non-linear semiconductor waveguide;

a supervisory laser light source which supplies supervisory light with a third wavelength to the optical interferometer; and a control means to which supervisory light output from the optical interferometer is input as output supervisory light and which controls the adjusting means according to the output supervisory light to adjust the optical intensity of the first input light.

According to another aspect of the invention, a wavelength converter for converting input light with a first wavelength into output light with a second wavelength, comprises:

an optical interferometer to which the input light and supervisory light with the second wavelength are input and which is composed of a non-linear semiconductor waveguide; and a control means to which supervisory light output from the optical interferometer is input as output supervisory light and which controls the phase bias of the interferometer according to the output supervisory light.

According to another aspect of the invention, a wavelength converter for converting input light with a first wavelength into output light with a second wavelength, comprises:

an adjusting means which adjusts the optical intensity of the input light to give adjusted input light;

an optical interferometer to which the input light and supervisory light with the second wavelength are input and which is composed of a non-linear semiconductor waveguide; and a control means to which supervisory light output from the optical interferometer is input as output supervisory light and which controls the adjusting means according to the output supervisory light to adjust the optical intensity of the input light.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
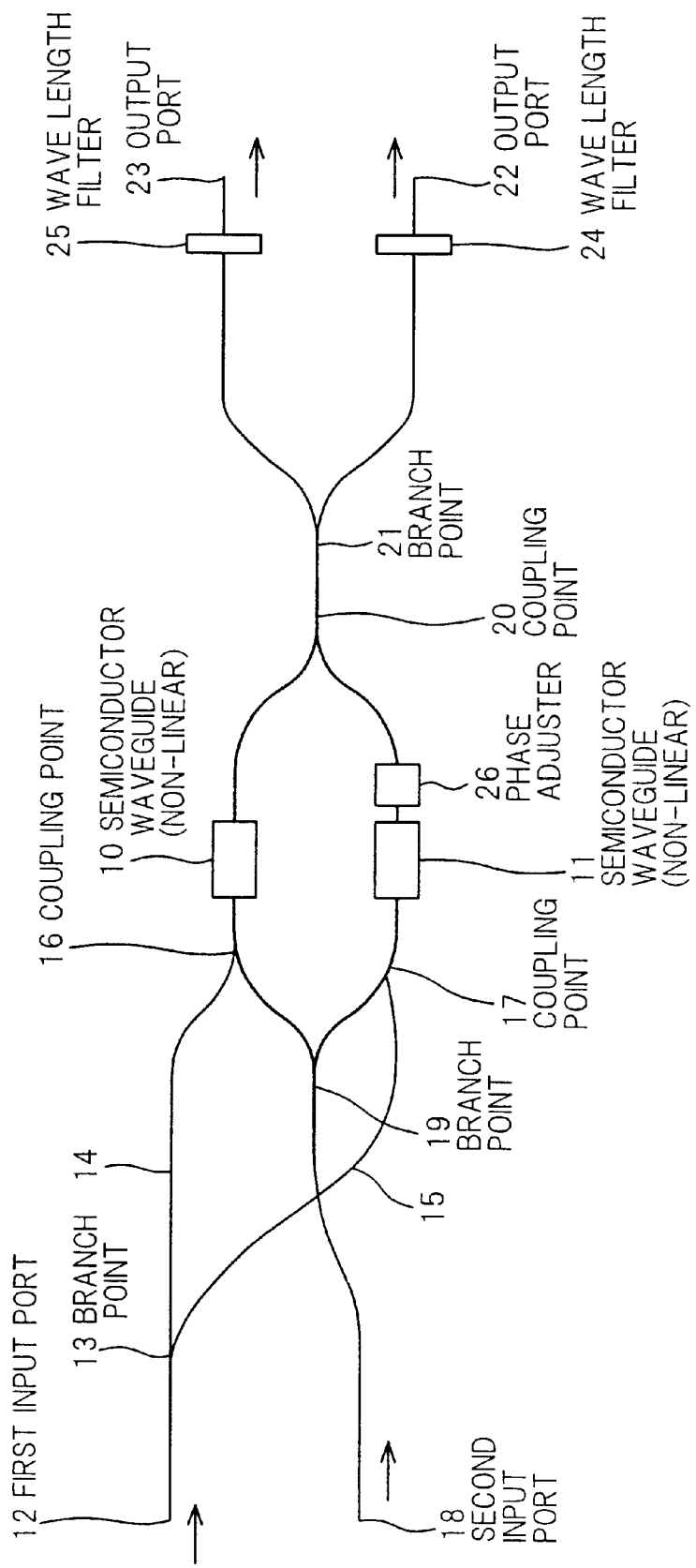
FIG. 1 is an illustration showing the composition of the conventional all-optical switch (prior art 1)
Figure 2A:
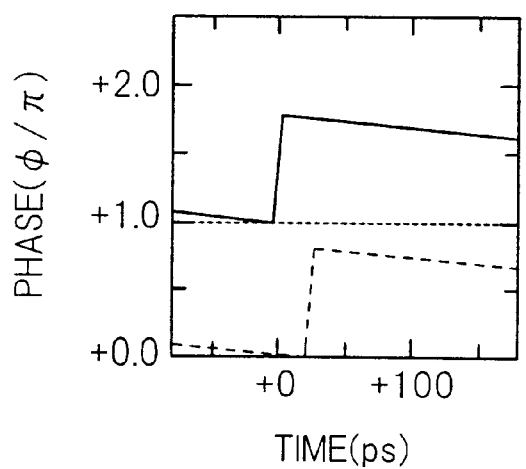
FIGS. 2A to 2C are graphs showing an example of operation of the all-optical switch in FIG. 1 (operational example 1)
Figure 2B:
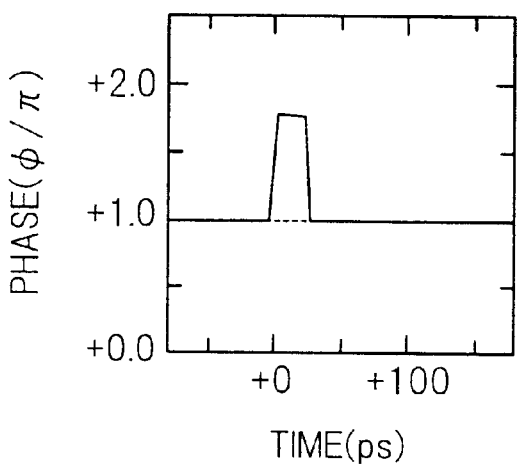
Figure 2C:
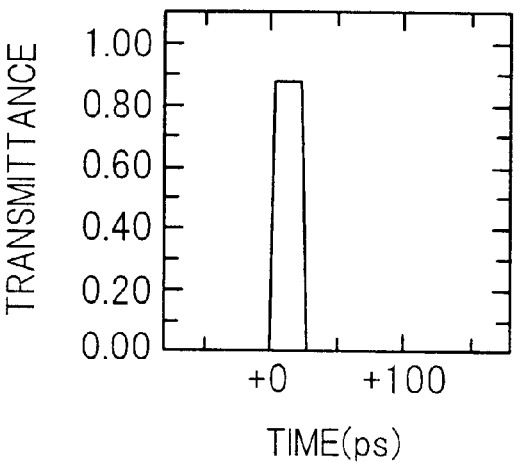
Figure 3A:
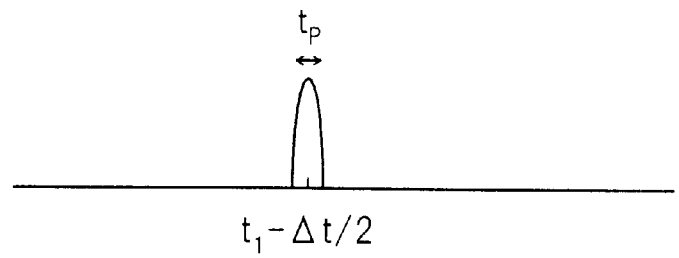
FIGS. 3A to 3E are illustrations showing the extraction operation of signal pulse in the all-optical switch in FIG. 1, FIGS. 4A to 4D are graphs showing an example of operation of the all-optical switch in FIG. 1 (operational example 2)
Figure 3B:
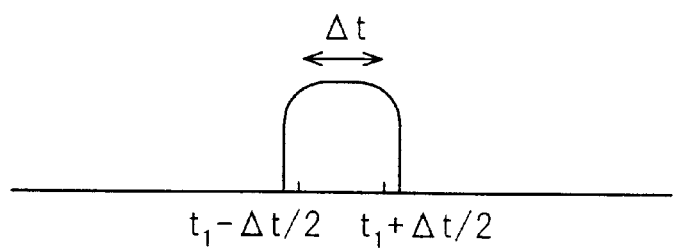
Figure 3C:
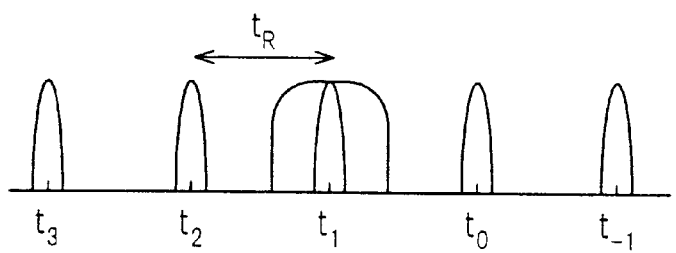
Figure 3D:
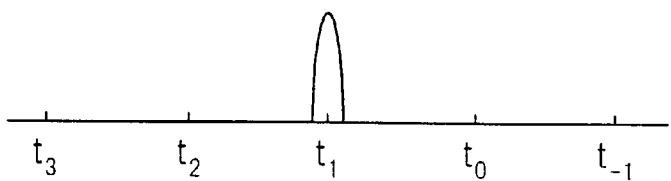
Figure 3E:
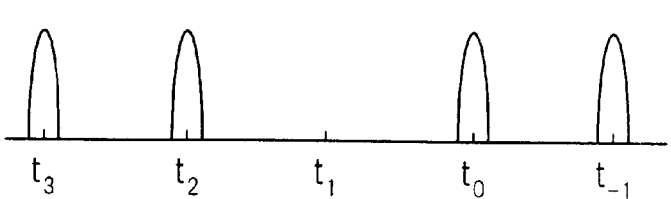

The preferred embodiments of this invention will be explained below referring to the drawings.

Figure 7:
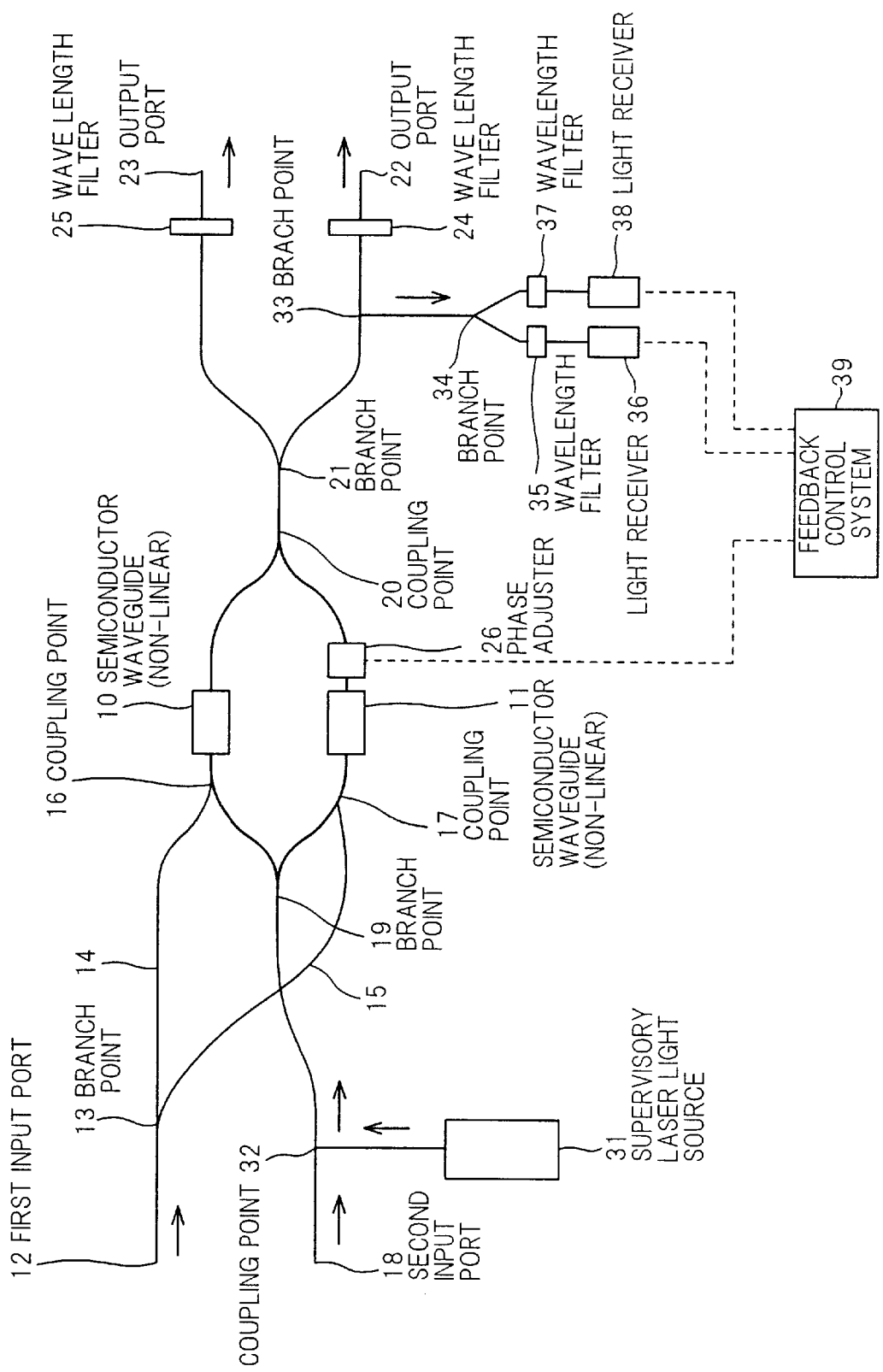
FIG. 7 is an illustration showing an all-optical switch in a first preferred embodiment according to the invention.
Figure 8A:
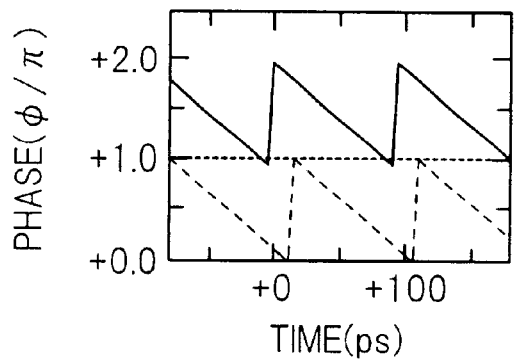
FIGS. 8A to 8D are graphs showing an operational state that phase bias is set to $\phi_b=0.90\pi$ instead of $\phi_b=\pi$ in the operational example 2.
Figure 8B:
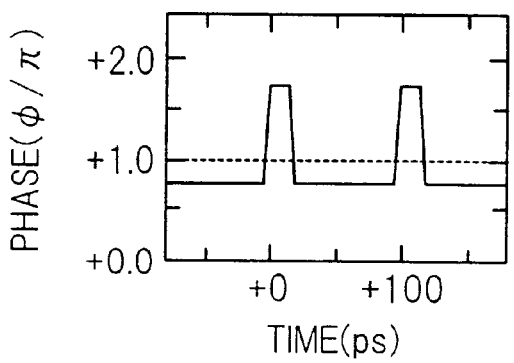
Figure 8C:
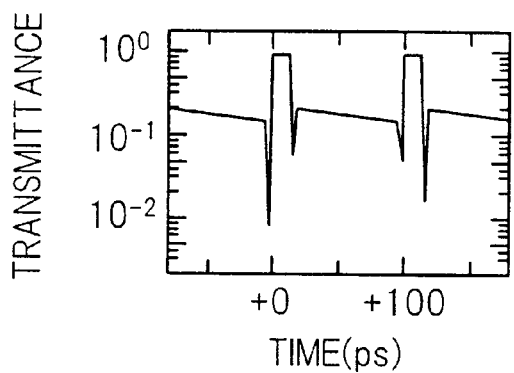
Figure 8D:
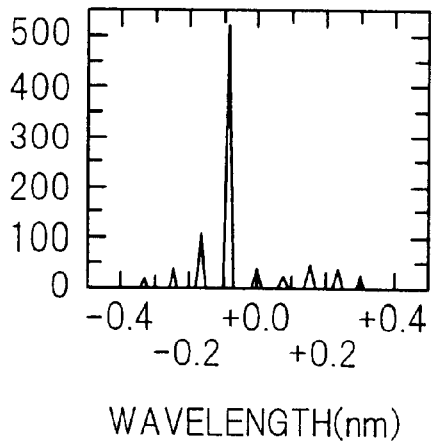
Figure 9A:
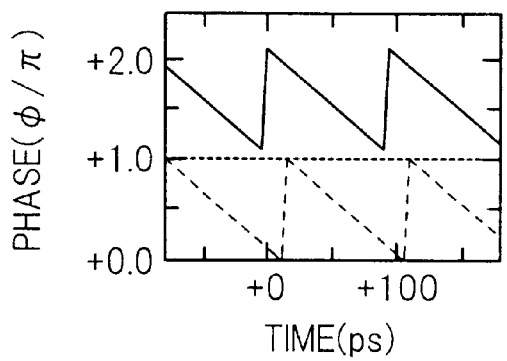
FIGS. 9A to 9D are graphs showing an operational state that phase bias is set to $\phi_b=1.10\pi$ in the operational example 2.
Figure 9B:
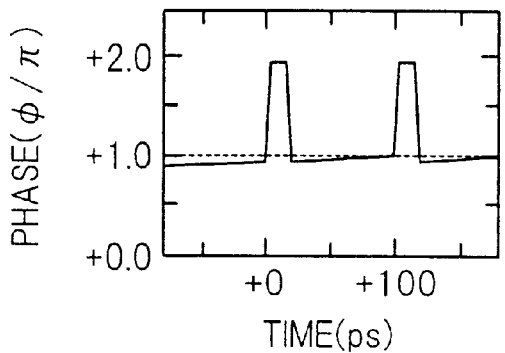
Figure 9C:
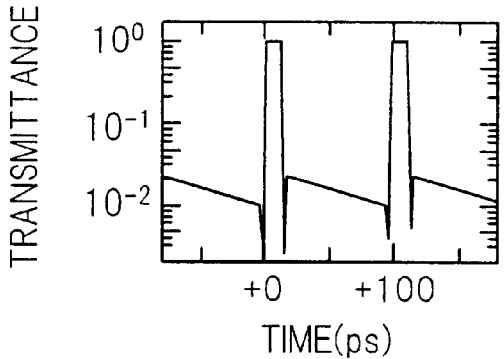
Figure 9D:
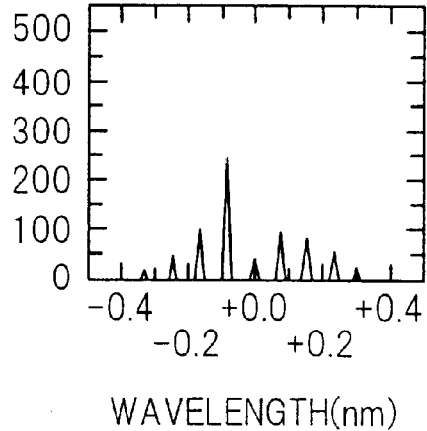

First, referring to FIG. 7, the first preferred embodiment is explained.

[First Embodiment]

As to an all-optical switch shown, like parts are indicated by like reference numerals as used in FIG. 1. Other than the like parts, the all-optical switch shown is further composed of a supervisory laser light source 31, a spectrum component analyzer and a feedback control system 39. The spectrum component analyzer is composed of a branch point 34, wavelength filters 35, 37 and light receivers 36, 38.

The supervisory laser light source 31 outputs supervisory light, which is continuous light with a wavelength of $\lambda_3$. Also, the supervisory laser light source 31 has a spectrum width that is sufficiently narrower than the repetition frequency of control optical pulse.

The center wavelength of the wavelength filter 35 is $\lambda_3$, and the wavelength bandwidth is around the repetition frequency of control optical pulse. When the repetition frequency of control optical pulse is 10 GHz and $\lambda_3$ is 1.58 μm, a bandwidth of about 2.5 to 25 GHz (0.02 to 0.2 nm) is desirable. The wavelength bandwidth of the wavelength filter 37 is relatively wide, and the center wavelength is $\lambda_3$.

Supervisory light output from the supervisory laser light source 31 is supplied to a coupling point 32, and then it tracks the same paths as signal optical pulse to the branch point 21. Namely, supervisory light in interference light is divided (branched) at the branch point 21, supplied to the wavelength filter 24 side and to the wavelength filter 25. Supervisory light supplied to the wavelength filter 25 side is removed by the wavelength filter 25. On the other hand, supervisory light supplied to the wavelength filter 24 is further divided at the branch point 33, and one supervisory light is removed by the wavelength filter 24. Another supervisory light is further divided at the branch point 34 (herein, one supervisory light divided at the branch point 34 is called first supervisory light and another is called second supervisory light). The first supervisory light reaches the light receiver 36 through the wavelength filter 35. On the other hand, the second supervisory light reaches the light receiver 38 through the wavelength filter 37. Then, the first and second supervisory lights intensities are supplied to the feedback control system 39.

As described above, by supplying supervisory laser light (supervisory light) from the supervisory laser light source 31 to the all-optical switch, the transmittance (switch-on state) to signal light of the all-optical switch can be monitored. Since supervisory light tracks the same paths as signal optical pulse as described earlier, it reaches the branch point 34 (entrance of the spectrum component analyzer) only when the transmittance of all-optical switch is not zero.

In the all-optical switch in FIG. 7, the phase adjuster 26 is, as described below, controlled by the feedback control system 39.

At first, a phase bias, which is different from equation (9) described earlier, is set by the phase adjuster 26. For example, the phase bias is set so that the spectrum of supervisory light reaching the spectrum component analyzer forms single-peak spectrum. In the feedback control system 39, the ratio of the intensity of supervisory light transmitting through the wavelength filter 35 and the intensity of supervisory light transmitting through the wavelength filter 37 is monitored through the light receivers 36, 38, thereby it is judged whether the single-peak state is obtained or not. Then, the feedback control system 39 always keeps the phase bias of the all-optical switch in operation at an optimum value. Namely, the feedback control system 39 always monitors the intensity ratio of supervisory light, sending a feedback signal to the phase adjuster 26 so as to keep the ratio of the spectrum intensities of supervisory lights at the optimum value.

Here, the mechanism that the extinction ratio of all-optical switch is improved by setting the phase bias properly is explained below. When the phase bias is set at an optimum value, the spectrum of supervisory light transmitted becomes single-peak. Meanwhile, in next explanations, how to calculate the optimum ratio of the intensity of supervisory light is explained as well.

As an example of operation of all-optical switch with an extinction ratio deteriorated, the spectrum of supervisory light transmitted when supervisory light is supplied to the all-optical switch in the operational example 2 described earlier is shown in FIG. 4D. Here, the spectrum axis is made wavelength difference $\Delta\lambda=\lambda-\lambda_3$. The output spectrum of supervisory light is discrete and the interval of spectrum is equal to the repetition frequency of control optical pulse (10 GHz=0.08 nm @ 1.58 µm).

Figure 4A:
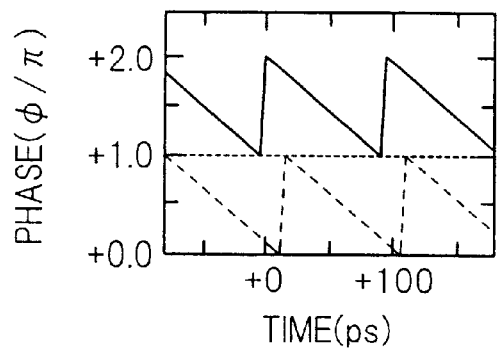
Figure 4B:
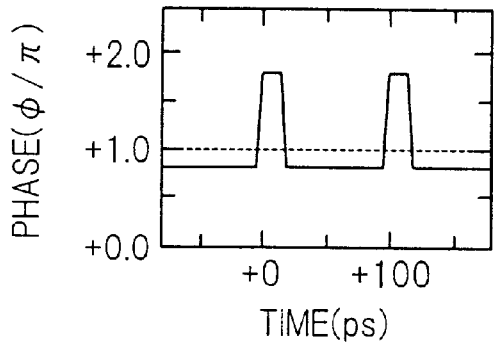
Figure 4C:
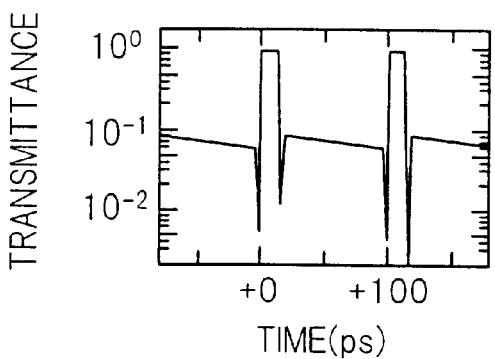
Figure 4D:
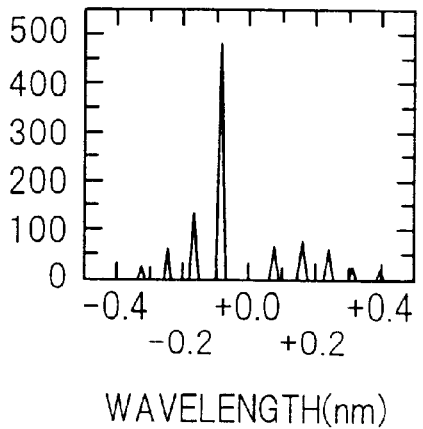
Figure 5A:
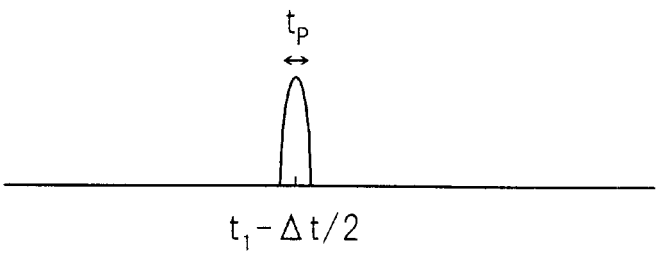
FIGS. 5A to 5E are illustrations showing the extraction operation of signal pulse in the operational example 2.
Figure 5B:
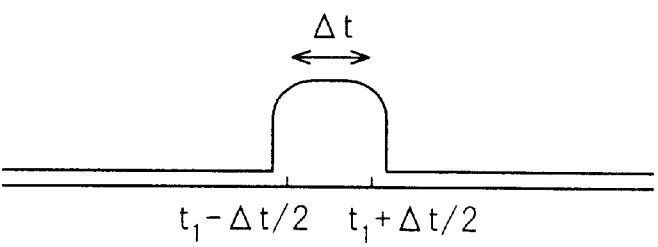
Figure 5C:
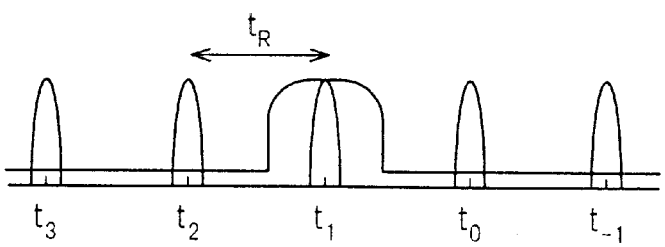
Figure 5D:
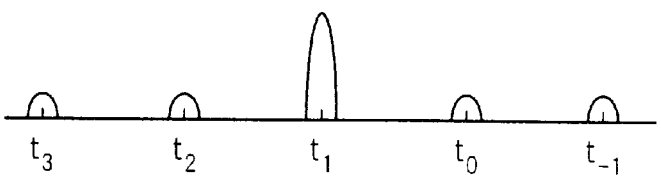
Figure 5E:
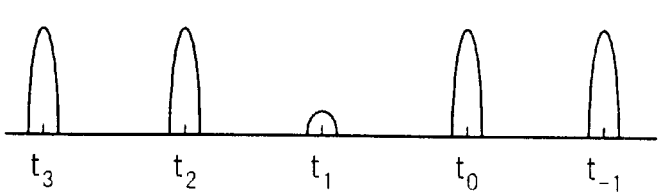

In the spectrum shown in FIG. 4D, it is found that the spectrum component with $\lambda=\lambda_3$ is zero and it is divided into short-wavelength components with $\lambda<\lambda_3$ and long-wavelength components with $\lambda>\lambda_3$ (twin-peak spectrum). This is explained below as described in Opt. Lett. vol. 23, No. 23, pp. 1846–1848, December 1998.

The output electric field of supervisory light is, from equations (3) and (4), given by:

$$E_M(t)=E_A(t)+E_B(t)=(-\exp[i\{\Phi_B(t+\Delta t)+\Phi_b\}]+\exp[i\Phi_B(t)])=$$

$$(\exp[i\{\Phi_B(t+\Delta t)+\Phi_b\}]+\exp[\Phi_B(t)])=(-\exp[i\Phi_B(t+\Delta t)]+\exp[i\Phi_B(t)]) \quad (12)$$

The output spectrum of supervisory light is given by:

$$F(\Delta\omega)=|\int E_M(t')\cdot\exp(i\Delta\omega t')dt'|^2 \quad (13)$$

In the conventional operation conditions, as shown in equation (9), $\phi_b=\pi$ is obtained.

Hereupon, a spectrum component at $\Delta\omega=0(\lambda=\lambda_3)$ is given by:

$$\begin{aligned}F(\Delta\omega=0)&=\left|\int E_M(t')dt'\right|^2 \\ &=\left|\int(-\exp[i\Phi_B(t'+\Delta t)]+\exp[i\Phi_B(t')])dt'\right|^2 \\ &=\left|\int(-\exp[i\Phi_B(t'+\Delta t)])dt'+\int\exp[i\Phi_B(t')]dt'\right|^2 \\ &=\left|\int(-\exp[i\Phi_B(t')])dt'+\int\exp[i\Phi_B(t')]dt'\right|^2 \\ &=0\end{aligned} \quad (14)$$

On the other hand, the deterioration in extinction ratio is caused by that the phase difference ($\phi_A-\phi_B$) at time zone ($t<t_0$ or $t<t_0+\Delta t$) that the transmittance should be zero is deviated from $\pi$ (FIG. 4B).

When the interval of operation time of all-optical switch is relatively short, as seen from FIG. 4A, at switch-off time zone ($t<t0$ and $t<t0+\Delta t$), equation (15) is applicable approximately.

$$\Phi_A(t)-\Phi_B(t)=\Phi_b-\Delta\Phi_{NL}\cdot\frac{\Delta t}{t_R} \quad (15)$$

In the operational example 2, $\phi_b=\pi$, $\Delta\phi_{NL}=0.49\pi$, $\Delta t=25$ ps and $t_R=100$ ps are given. The phase difference ($0.88\pi$) at switch-off time zone calculated by equation (15) is nearly equal to the actual phase difference ($0.87\pi$, FIG. 4B) at switch-off time zone. Accordingly, at the switch-off time zone, the optimum value of phase bias to satisfy the extinction condition:

$$\phi_A(t)-\phi_B(t)=\pi \quad (16)$$

is, instead of equation (9), given by:

$$\Phi_b=\pi+\Delta\Phi_{NL}\cdot\frac{\Delta t}{t_R} \quad (17)$$

In the operational example 2, its $\phi_b$ about $1.12\pi$.

FIGS. 8A to 11D show operational examples that the phase bias in the operational example 2 is, instead of $\phi_b=\pi$, set to $\phi_b=0.90\pi$, $1.10\pi$, $1.17\pi$ and $1.25\pi$.

Figure 10A:
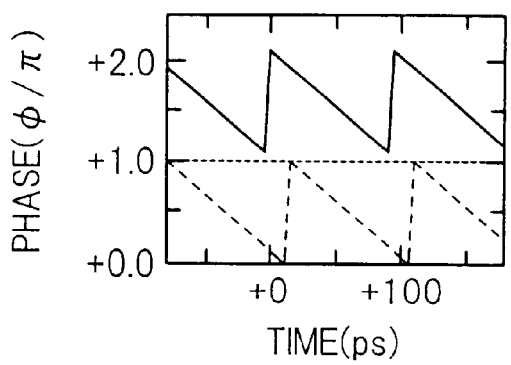
FIGS. 10 to 10D are graphs showing the optimum operational state of the all-optical switch in FIG. 7, where phase bias is set to $\phi_b=1.17\pi$ in the operational example 2.
Figure 10B:
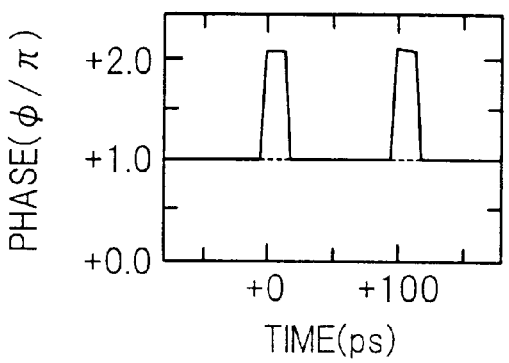
Figure 10C:
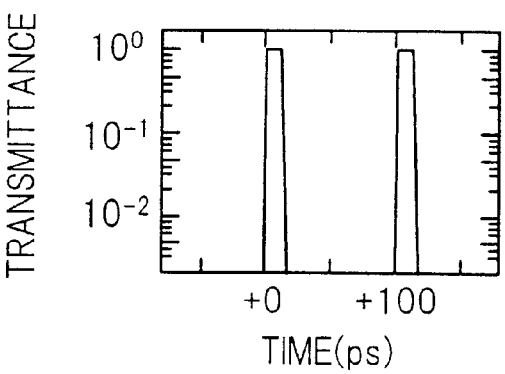

In this example, when $\phi_b=1.17\pi$ is set, the phase difference at switch-off time zone becomes $\pi$ (FIG. 10B). As a result, the extinction ratio is improved higher than 30 dB (FIG. 10C). This phase bias value is nearly equal to that calculated from equation (17).

As described above, the extinction ratio can be improved by setting the phase bias to $\phi_b=1.17\pi$ instead of $\phi_b=\pi$. This is because when the operation conditions satisfy:

$$\Delta t < t_R << \tau_c \tag{18}$$

in this operational example the recovery curve of phase becomes linear as shown in FIG. 10A. The linear recovery curve of phase after incurring the non-linear phase shift is, for example, reported in Journal of Optical Society of America, Part B, vol.14, pp.3204–3216, 1997.

The spectrum of transmission supervisory light shows a systematic change from twin-peak spectrum to single-peak spectrum, and further from single-peak spectrum to twin-peak spectrum, while reflecting very well the change of phase difference at switch-off time band. In the optimum state of phase bias, where the phase difference at switch-off time zone becomes $\pi$, the envelope curve of transmission supervisory light spectrum gives the single-peak spectrum (FIG. 10D).

The mechanism that when the extinction ratio of all-optical switch is high, the spectrum of transmission supervisory light gives the single-peak spectrum is analogous to that of the spectrum of mode-locked laser light. In case of mode-locked laser, for isolated pulse at even intervals with a pulse width of $T_0$ and a pulse interval of $T_1$, a gentle and single-peak discrete spectrum, where the wavelength difference between any two adjacent spectrum components is equal to $1/T_1$. The width of the envelope curve of spectrum is about $1/T_0$.

In case of all-optical switch, when the transmission supervisory light becomes isolated pulse due to the improvement of extinction ratio, a gentle single-peak spectrum is obtained. The width of the envelope curve of spectrum is around $1/\Delta t$.

Figure 10D:
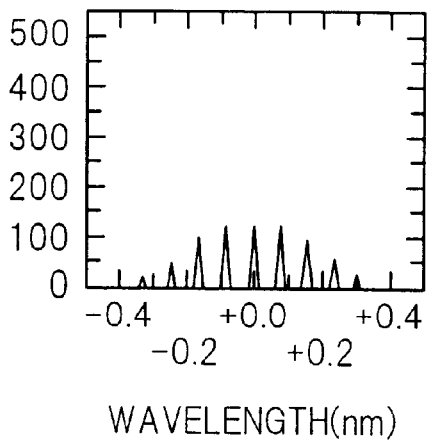
Figure 11A:
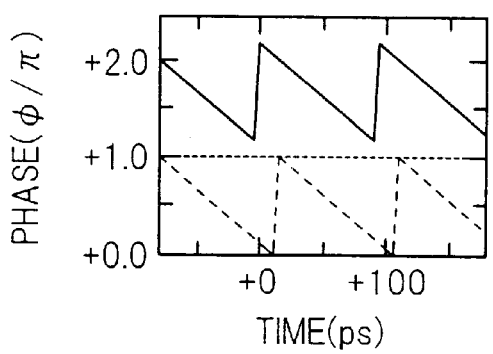
FIGS. 11A to 11D are graphs showing an operational state that phase bias is set to $\phi_b=1.25\pi$ in the operational example 2.
Figure 11B:
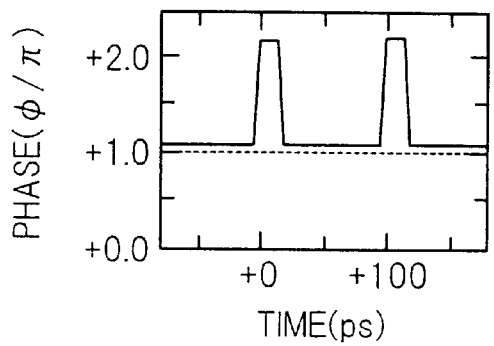
Figure 11C:
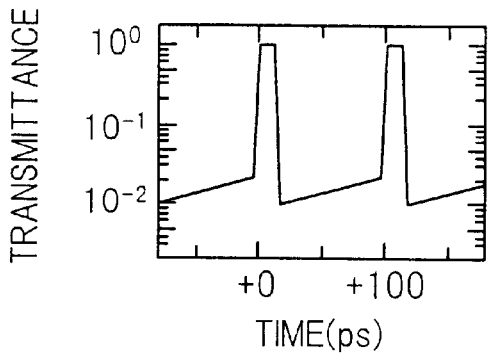
Figure 11D:
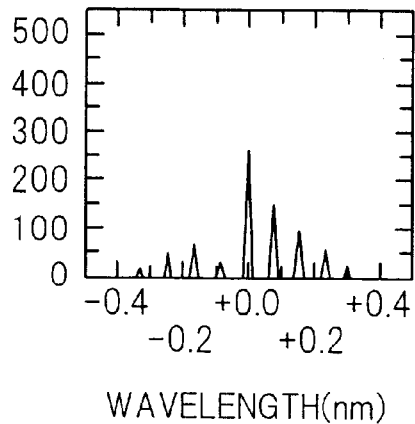

When the bandwidth of the wavelength filter 35 is 10 GHz (0.08 nm) and the bandwidth of the wavelength filter 37 is 1 nm, the intensity ratio {(light-receiving intensity at the light receiver 36)/(light-receiving intensity at the light receiver 38)} of supervisory light obtained by the spectrum analysis of the single-peak spectrum in FIG. 10D is about 0.2. Namely, the optimum value of supervisory light intensity ratio in this operational example is 0.2.

Therefore, the feedback control system 39 controls the phase adjuster 26 so that the intensity ratio of supervisory light is always kept to be 0.2. When the intensity ratio of supervisory light exceeds 0.2, it reduces the phase bias $\phi_b$. When the intensity ratio of supervisory light is under 0.2, it increases the phase bias $\phi_b$.

Figure 12:
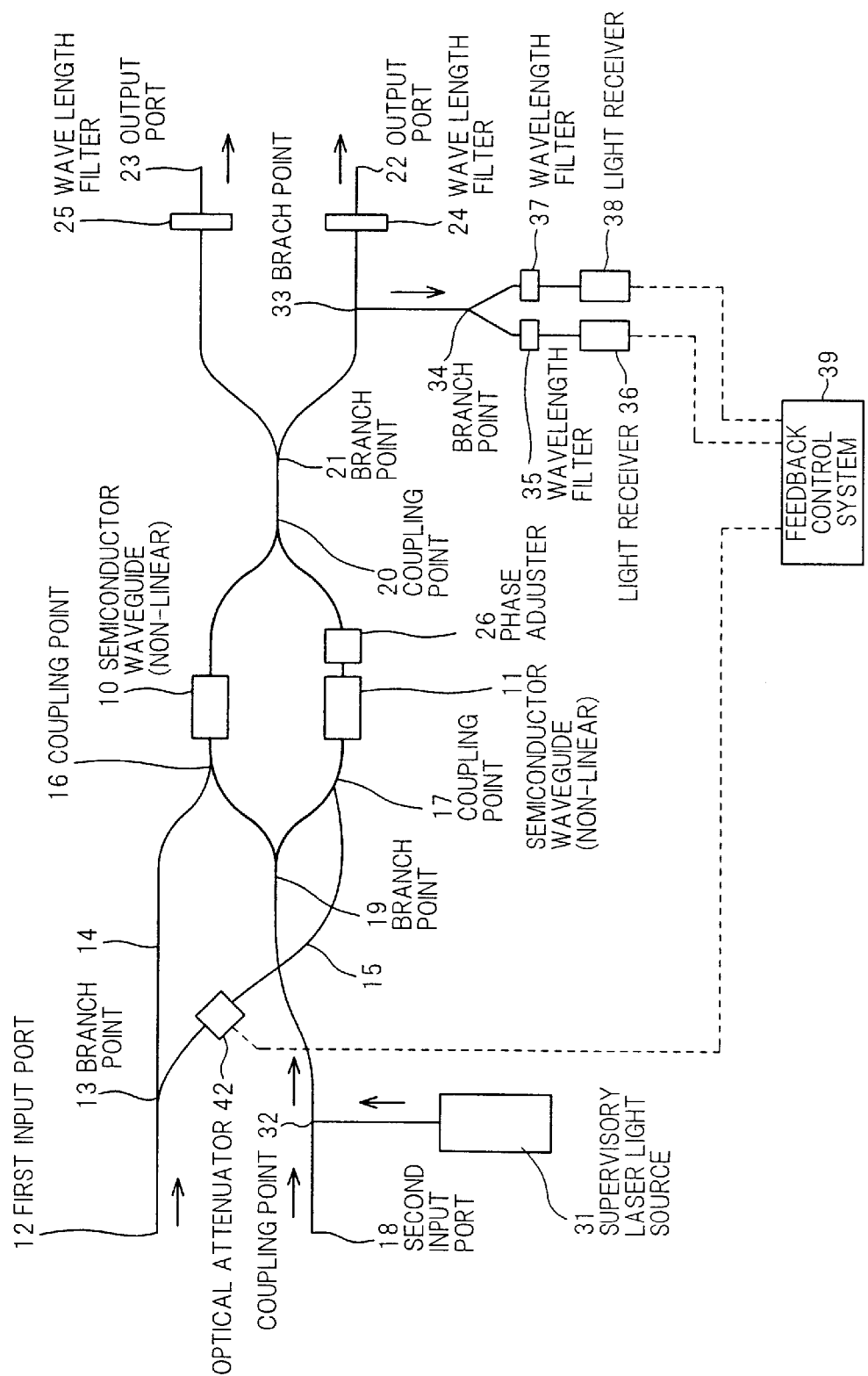
FIG. 12 is an illustration showing an all-optical switch in a second preferred embodiment according to the invention.
Figure 13A:
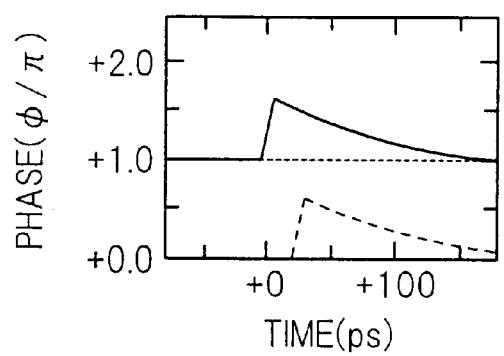
FIGS. 13A to 13D are graphs showing an operational state that non-linear phase shift is set to $\phi_B=1.15\phi_A$ instead of $\phi_B=\phi_A$ in the operational example 3.
Figure 13B:
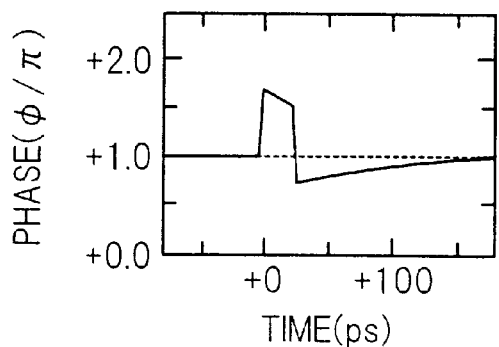
Figure 13C:
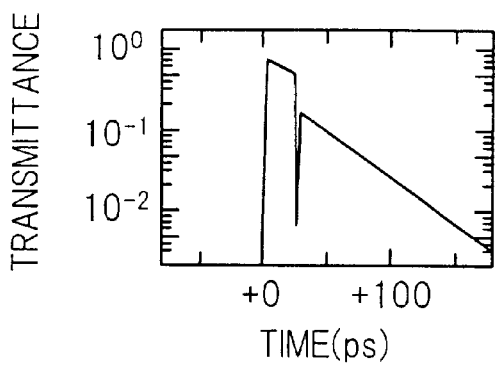
Figure 13D:
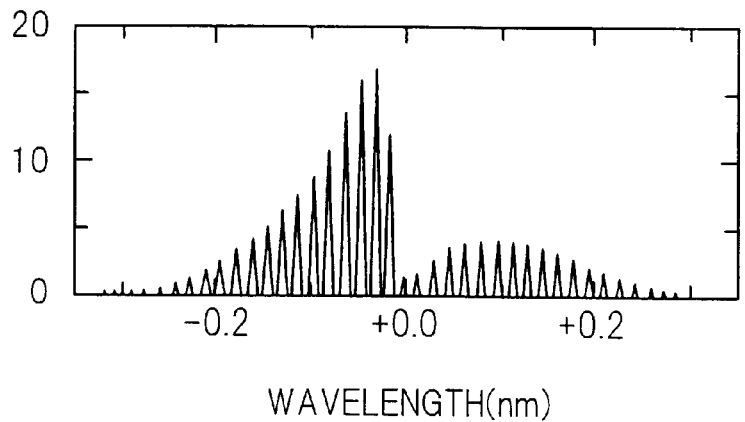
Figure 14A:
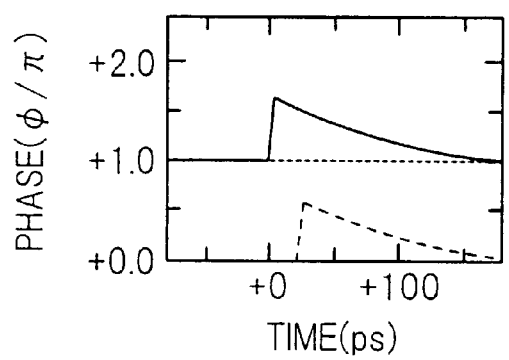
FIGS. 14A to 14D are graphs showing an operational state that non-linear phase shift is set to $\phi_B=0.85\phi_A$ in the operational example 3.
Figure 14B:
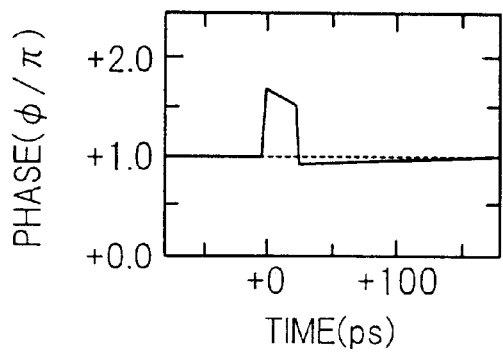
Figure 14C:
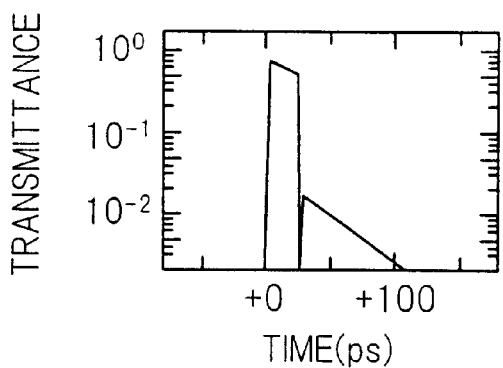
Figure 14D:
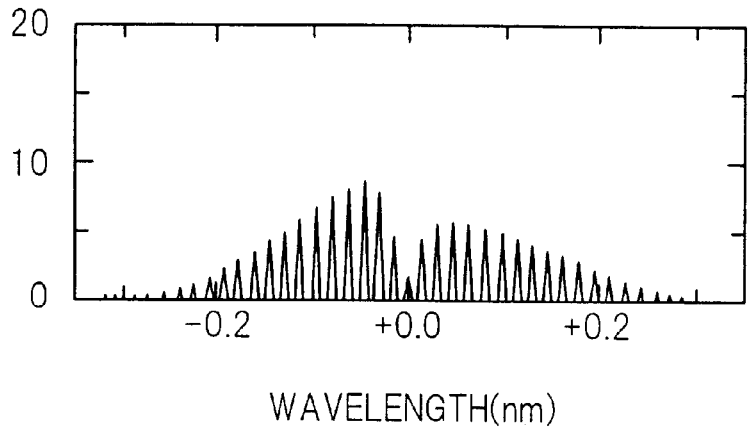

Next, referring to FIG. 12, the second preferred embodiment will be explained.

[Second Embodiment]

As to an all-optical switch shown, like parts are indicated by like reference numerals used for the all-optical switch in FIG. 7. In FIG. 12, an optical attenuator 42 is further provided. The attenuation amount of the optical attenuator 42 is controlled by the feedback control system 39.

The all-optical switch shown improves the extinction ratio in the operational example 3 described earlier. In the embodiment shown, the amount of non-linear phase shift of the semiconductor waveguide 11 is set to a value different from that of the semiconductor waveguide 10. In this all-optical switch, like the all-optical switch in FIG. 7, the amount of the optical attenuator 42 is set so that the spectrum of transmission supervisory light reaching the spectrum component analyzer becomes a single-peak spectrum, thereby the amount of non-linear phase shift of the semiconductor waveguide 11 is set to an optimum value.

As described in the operational example 3, when the operation conditions satisfy:

$$\Delta t < t_R << \tau_c \tag{19}$$

by setting properly the amount of non-linear phase shift of the semiconductor waveguide 11, the extinction ratio of all-optical switch can be improved (for example, Japanese Journal of Applied Physics, vol.32, pp.1746–1749, 1993). When the amount of non-linear phase shift is set to the optimum value, the spectrum of supervisory light becomes a single-peak spectrum, like the all-optical switch in FIG. 7.

Meanwhile, the carrier lifetime in semiconductor waveguide becomes short so that the operation conditions in equation (19) is easy to satisfy, when the amount of current supplied into semiconductor optical amplifier is large and the carrier density is high, when semiconductor is made by crystal growth method with low growth temperature, when high-concentration impurity in implanted into semiconductor, or when quantum wire semiconductor, quantum dot semiconductor or inter-subband-transition semiconductor is used.

Figure 6A:
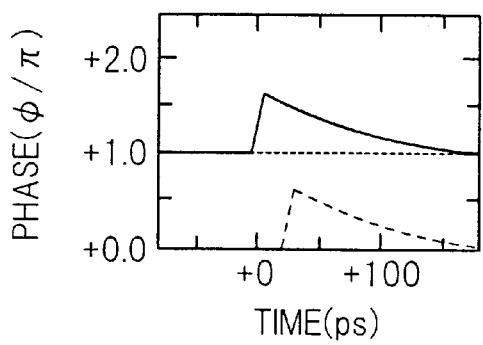
FIGS. 6A to 6D are graphs showing a further example of operation of the all-optical switch in FIG. 1 (operational example 3)
Figure 6B:
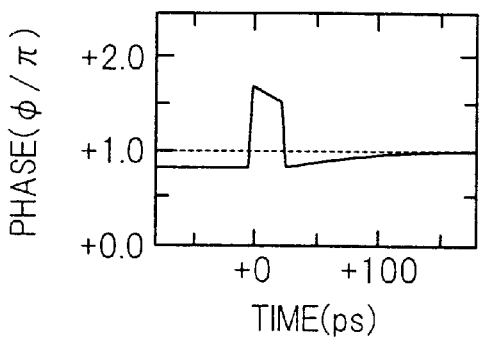
Figure 6C:
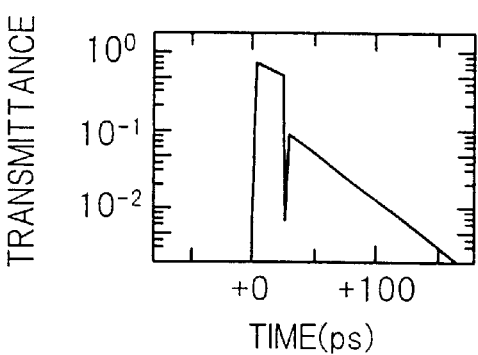
Figure 6D:
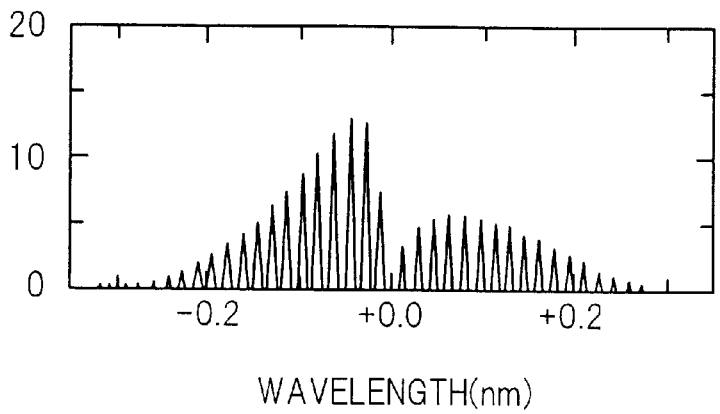

Taking the operational example 3 as an example, the operation conditions and examples of supervisory light spectrum of the all-optical switch are explained below. In the operational example 3, the amount ($\phi_A$) of non-linear phase shift of the semiconductor waveguide 10 is equal to that ($\phi_B$) of the semiconductor waveguide 11, $\phi_B=\phi_A=0.63\pi$ is given (FIG. 6A). When supervisory light is input to the all-optical switch on this condition, the spectrum of transmission supervisory light becomes a twin-peak spectrum (FIG. 6D). According to equation (14), the spectrum component at $\lambda=\lambda_3$ is zero.

In this example, by adjusting the attenuation amount of the optical attenuator 42, the amount $\phi_B$ of non-linear phase shift is changed. FIGS. 13A to 16D show operational examples that the amount of non-linear phase shift is, instead of $\phi_B=\phi_A$, set to $\phi_B=1.15\phi_A$, $\phi_B=0.85\phi_A$, $\phi_B=0.70\phi_A$, and $\phi_B=0.55\phi_A$.

Figure 15A:
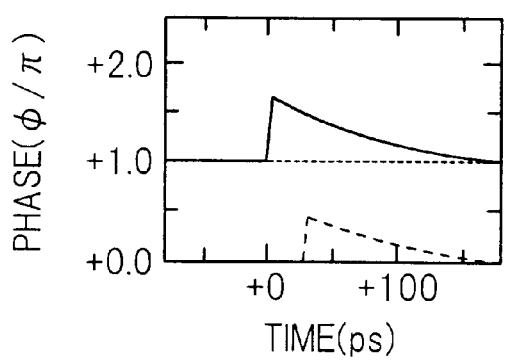
FIGS. 15A to 15D are graphs shoving the optimum operational state of the all-optical switch in FIG. 12, where non-linear phase shift is set to $\phi_B=0.70\phi_A$ in the operational example 3.
Figure 15B:
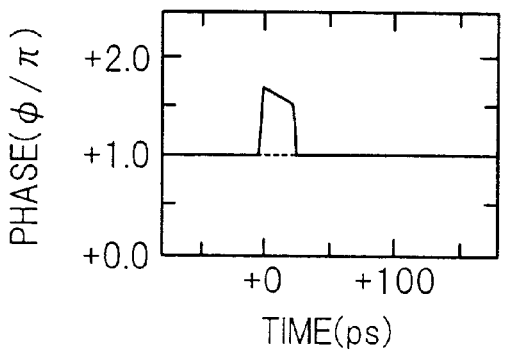
Figure 15C:
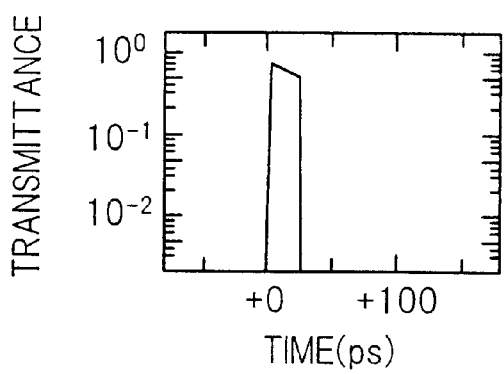

In this example, when $\phi_B=0.70\phi_A$ is set, the phase difference at switch-off time zone uniformly becomes $\pi$ (FIG. 15B). As a result, the extinction ratio is improved higher than 30 dB (FIG. 15C).

The spectrum of transmission supervisory light shows a systematic change, while reflecting very well the change of phase difference at switch-off time band. In the optimum amount ($\phi_B=0.70\phi_A$) of non-linear phase shift, where the phase difference at switch-off time zone becomes $\pi$, the envelope curve of transmission supervisory light spectrum gives a gentle single-peak spectrum (FIG. 15D).

Figure 15D:
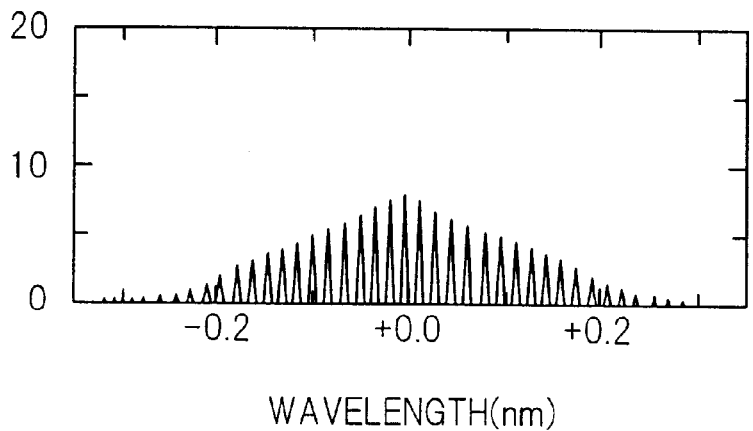
Figure 16A:
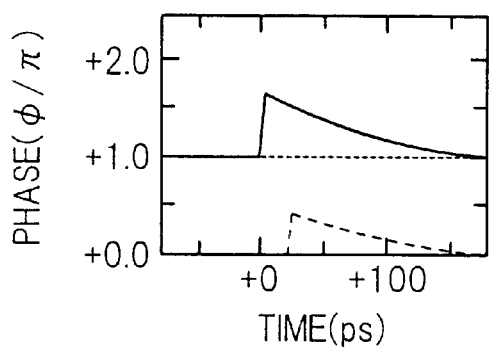
FIGS. 16A to 16D are graphs showing an operational state that non-linear phase shift is set to $\phi_B=0.55\phi_A$ in the operational example 3.
Figure 16B:
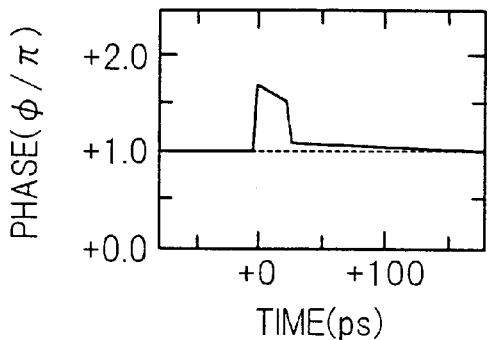
Figure 16C:
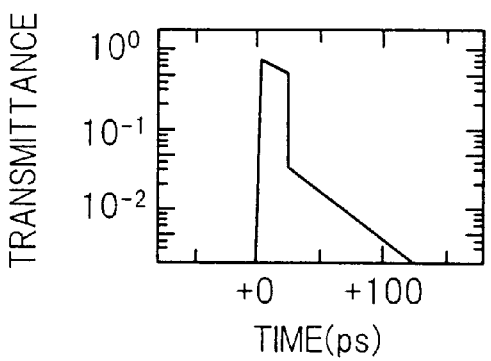
Figure 16D:
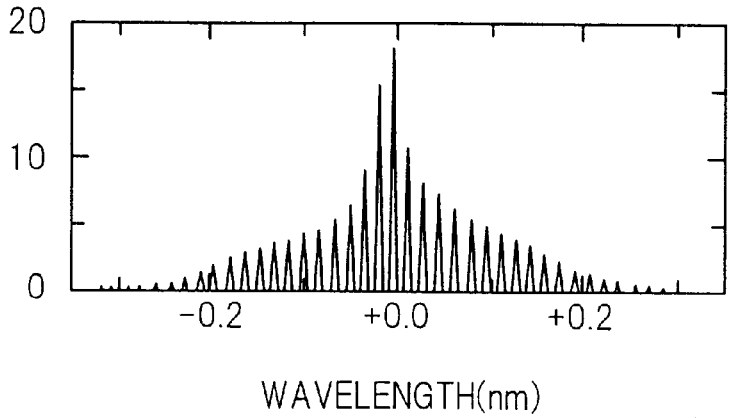

When the same wavelength filters 35, 37 as the all-optical switch in FIG. 7 are used, the intensity ratio of supervisory light in FIG. 15D is about 0.07. Namely, the optimum value of supervisory light intensity ratio in this operational example is 0.07.

Therefore, the feedback control system 39 controls the optical attenuator 42 so that the intensity ratio of supervisory light is always kept to be 0.07. When the intensity ratio of supervisory light exceeds 0.07, the amount ($\phi_B$) of non-linear phase shift is increased by reducing the attenuation amount. When the intensity ratio of supervisory light is under 0.07, the amount ($\phi_B$) of non-linear phase shift is reduced by increasing the attenuation amount.

Figure 17:
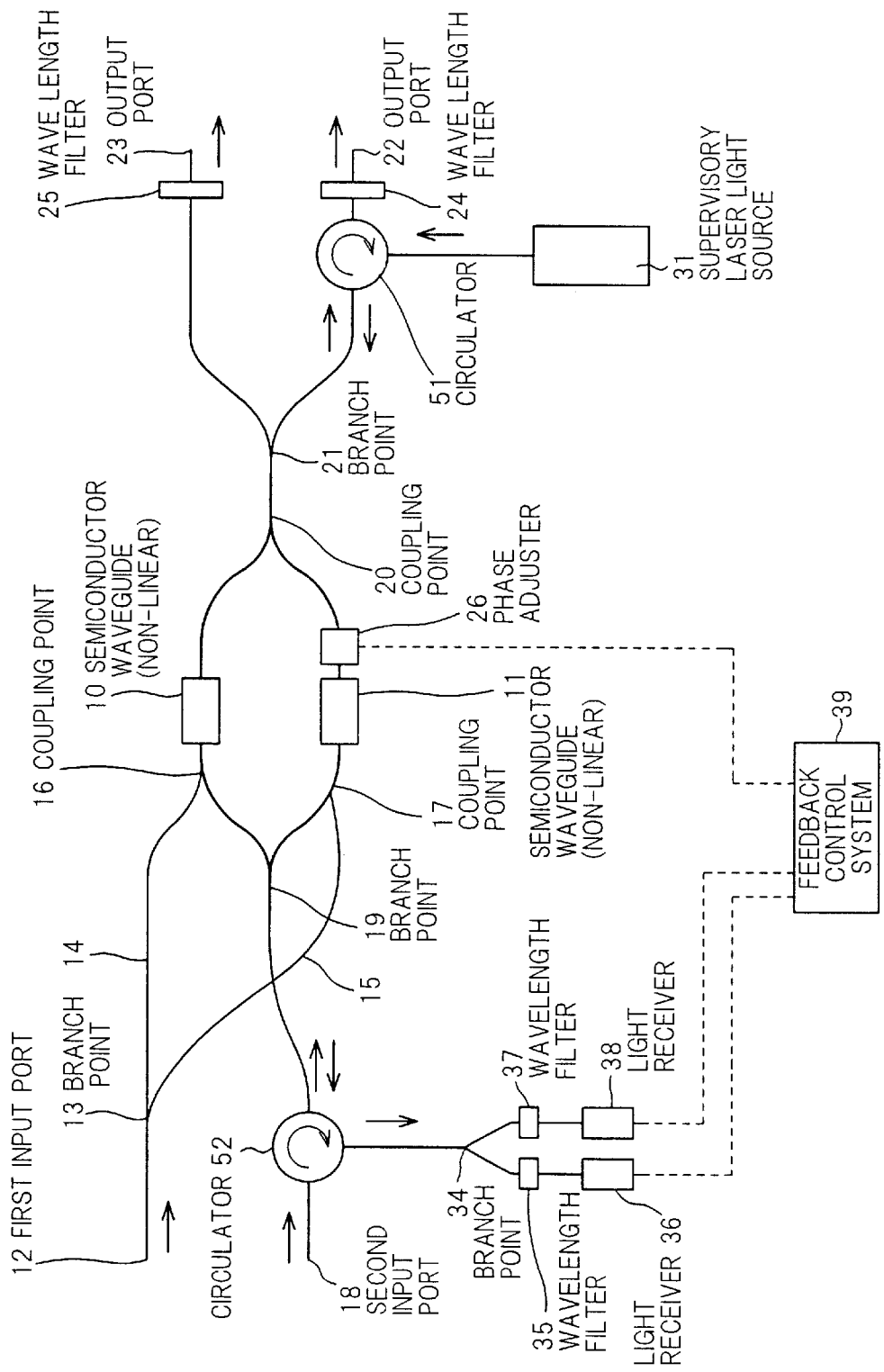
FIG. 17 is an illustration shoving an all-optical switch in a third preferred embodiment according to the invention.

Further, referring to FIG. 17, the third preferred embodiment will be explained.

[Third Embodiment]

As to an all-optical switch shown, like parts are indicated by like reference numerals used for the all-optical switch in FIG. 7. In FIG. 17, supervisory light is supplied in the direction opposite to the direction in FIG. 7. Namely, supervisory light is input and output opposite to signal light, and in this regard, the all-optical switch in FIG. 17 is equipped with circulators 51, 52. In the all-optical switch shown, supervisory light output from the supervisory laser light source 31 is input through the circulator 51 to the Mach-Zehnder interferometer, led to the spectrum component analyzer through the circulator 52.

In this embodiment, the separation between signal light and supervisory light becomes easy. Therefore, the wavelength of supervisory light may be the same as that of signal light.

Figure 18:
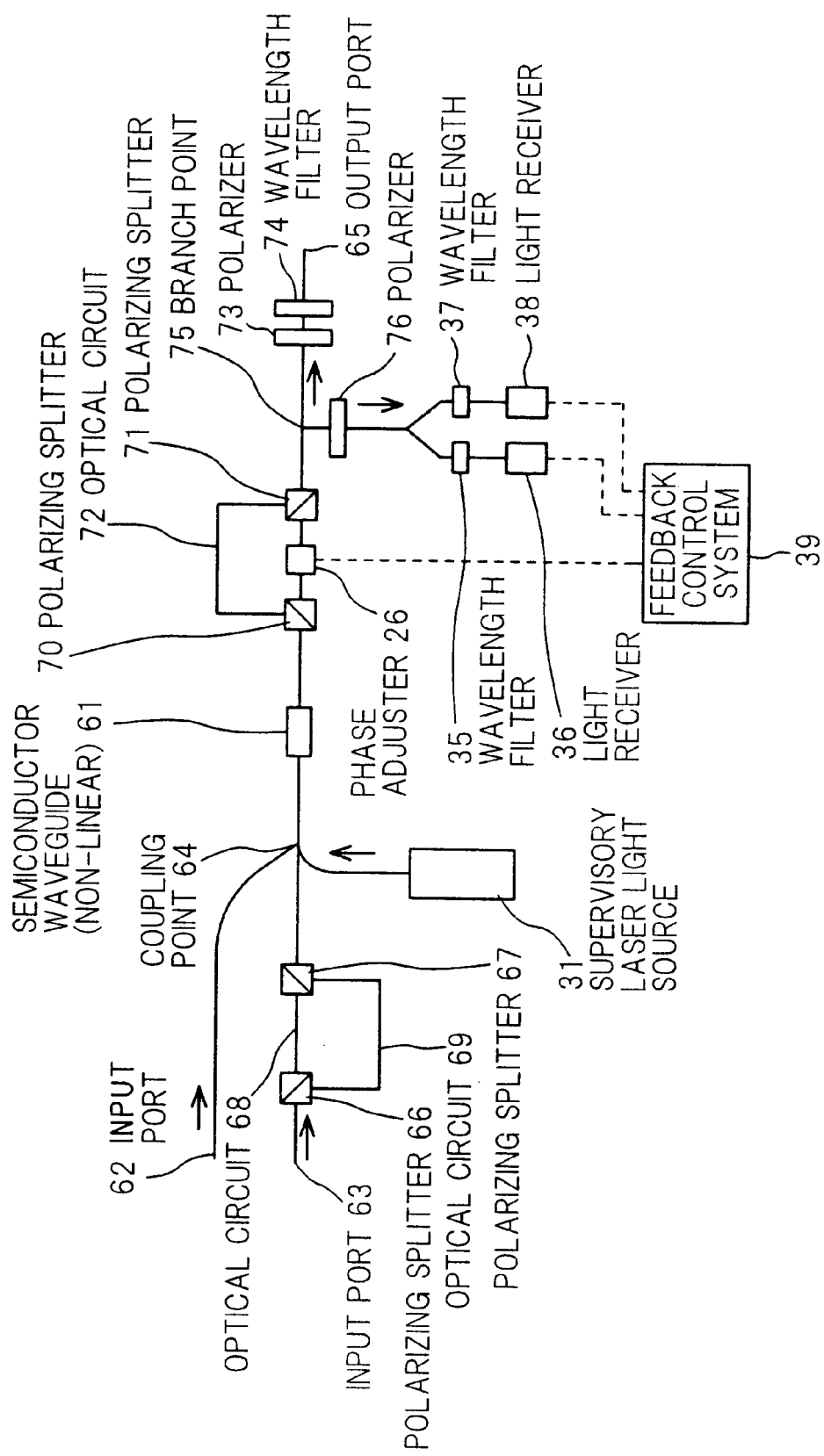
FIG. 18 is an illustration showing an all-optical switch in a fourth preferred embodiment according to the invention.

Referring to FIG. 18, the fourth preferred embodiment will be explained.

[Fourth Embodiment]

An all-optical switch shown in FIG. 18 is composed by applying this invention to the polarization separation type all-optical switch in prior art 2. In FIG. 18, control light pulse is input from an input port 62, led through a coupling point 64 to a semiconductor waveguide 61 to change the refractive index of the semiconductor waveguide. Meanwhile, in FIG. 18, like parts are indicated by like reference numerals used for the all-optical switch in FIG. 7.

On the other hand, signal optical pulse is input from an input port 63, and is divided into two orthogonal polarization components by a polarizing splitter 66. One orthogonal polarization component (component U) is led through an optical circuit 68, a polarizing splitter 67, the coupling point 64, the semiconductor waveguide 61, a polarizing splitter 70 and an optical circuit 72 to a polarizing splitter 71. Another orthogonal polarization component (component V) is led through an optical circuit 69, the polarizing splitter 67, the coupling point 64, the semiconductor waveguide 61, the polarizing splitter 70 and the phase adjuster 26 to the polarizing splitter 71, where it is coupled with component U.

The optical path length of the optical circuit 69 is longer than that of the optical circuit 68, and gives a delay time $\Delta t$ to signal light (component V). On the other hand, the optical path length of the optical circuit 72 is longer than that of the optical circuit extending from the polarizing splitter 70 through the phase adjuster 26 to the polarizing splitter 71, and gives a delay time nearly equal to $\Delta t$ to signal light (component U). Therefore, components U and V reach the polarizing splitter 71 almost concurrently.

Signal light coupled by the polarizing splitter 71 is led through a branch point 75, a polarizer 73 and a wavelength filter 74 to an output port 65.

Supervisory light is supplied to the coupling point 64 from the supervisory laser light source 31, and then is divided at a branch point 75 to reach the spectrum component analyzer. As described earlier, the feedback control system 39 controls the phase adjuster 26 according to output of the spectrum component analyzer.

Meanwhile, except that the polarization components are used, the all-optical switch in prior art 2 operates on the basis of the same operational principle as prior art 1. Also, the all-optical switch in FIG. 18 operates on the basis of the same operational principle as the all-optical switch in FIG. 7.

As seen from the first to fourth embodiments described above, this invention can apply to all all-optical switches based on the system that non-linear phase shift based on the band filling effect of semiconductor is given to two components of signal light, further a time difference is given to between the two components, then the two components are brought into interference. Although the first to fourth embodiments are examples that this invention applies to prior arts 1 and 2, this invention can apply to prior art 3 in like manner.

The all-optical switch in the first to fourth embodiments can operate as a wavelength converter. When it is used as a wavelength converter, e.g., when signal optical pulse sequence with a wavelength of $\lambda 1$ is converted into signal optical pulse sequence with a wavelength of $\lambda 2$, signal optical pulse sequence with a wavelength of $\lambda 1$ is input to the input port 12 (input port 62 in FIG. 18) and continuous laser light (supervisory light) with a wavelength of $\lambda 2$ is input to the input port 18 (input port 63 in FIG. 18). Signal optical pulse sequence with a wavelength of $\lambda 2$ is taken out of the output port 22 (output port 65 in FIG. 18).

Thus, when the all-optical switches in the first to fourth embodiments operate as a wavelength converter, continuous laser light with a wavelength of $\lambda 2$ is used as supervisory light. Therefore, supervisory light with a wavelength of $\lambda 3$ becomes unnecessary. Also, the center wavelength of wavelength filters 35, 37 of the spectrum component analyzer is made $\lambda 2$.

Figure 19:
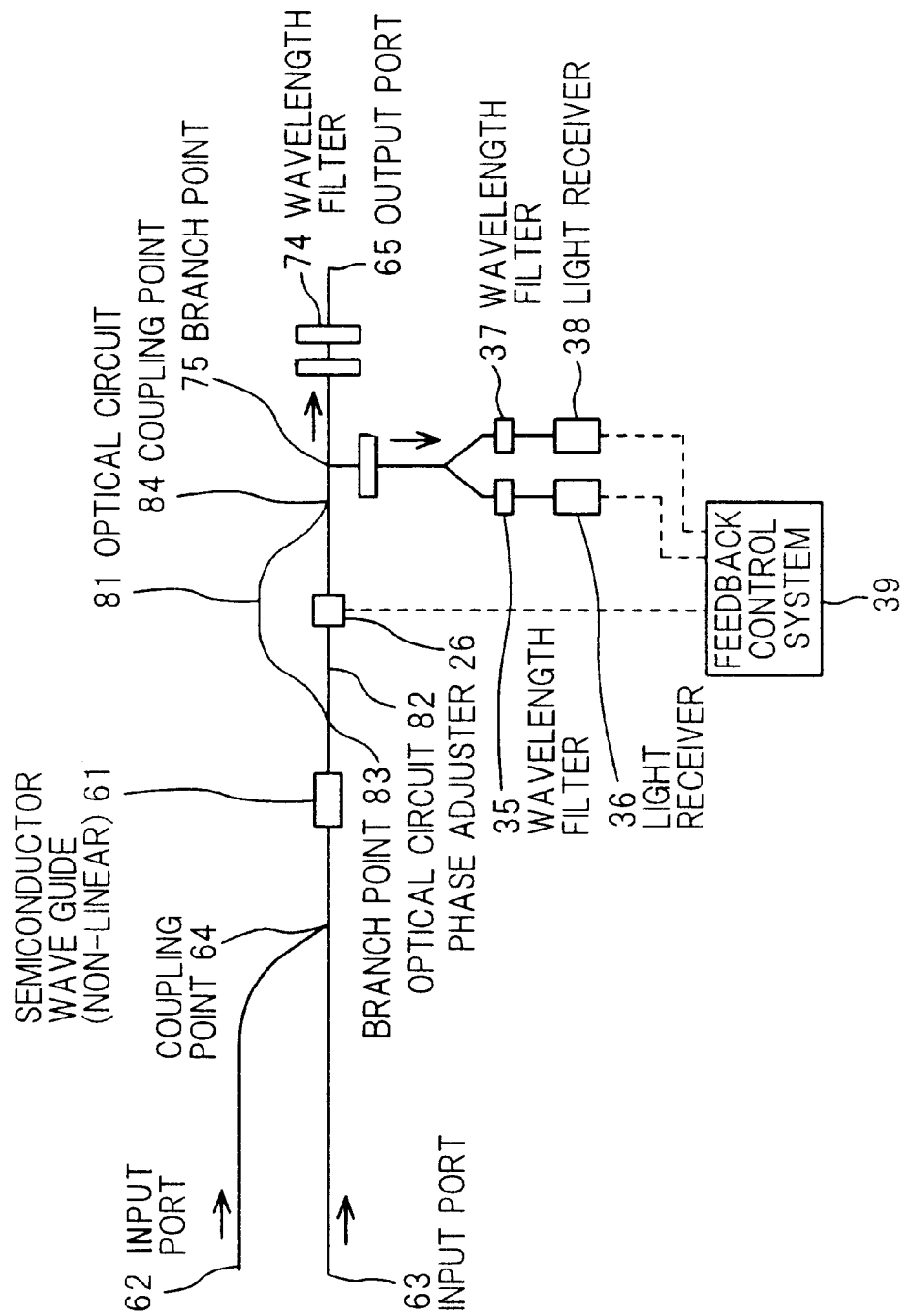
FIG. 19 is an illustration showing a wavelength converter in a fifth preferred embodiment according to the invention.

Referring to FIG. 19, the fifth preferred embodiment will be explained.

[Fifth Embodiment]

FIG. 19 shows an example of a wavelength converter. This is an example that this invention applies to prior art 4.

In FIG. 19, like parts are indicated by like reference numerals used in FIG. 18. In this embodiment, signal optical pulse sequence with a wavelength of $\lambda 1$ is supplied to the input port 62, and continuous light with a wavelength of $\lambda 2$ is supplied to the input port 63. Signal optical pulse is led through the coupling point 64 to the semiconductor waveguide 61. Continuous light is led through the coupling point 64 and semiconductor waveguide 61, and is divided into 50:50 at a branch point 83. One branch component (component B) is led through an optical circuit 81 to a coupling point 84, and another branch component (component A) is led through an optical circuit 82 and the phase adjuster 26 to the coupling point 84, where it is coupled with component B. Component B reaches the coupling point 64 $\Delta t$ later than component A. Continuous light coupled at the coupling point 84 is led through a branch point 75 and a wavelength filter 74 to the output port 65.

Branch component divided at the branch point 75 is led to the spectrum component analyzer, and the feedback control system 39 controls the phase adjuster 26 according to output of the spectrum component analyzer as described earlier.

Meanwhile, the operational mechanism of prior art 4 is based on the operational mechanism of the all-optical switch described in prior art 1 (for example, Japanese patent application laid-open No.9-111633 and IEEE Photonics Technology Letters, vol.10, pp.346–348, 1998). Therefore, the wavelength converter in FIG. 19 operates based on the principle that the all-optical switch in FIG. 7 operates as a wavelength converter.

The operation conditions of the all-optical switch and wavelength converter explained in the first to fifth embodiments above are not limited to equation (18) or (19). Even on the operation conditions that deterioration in extinction ratio is hard to incur as shown in the operational example 1, the all-optical switches of the invention are effective. As the all-optical switch operates for a long time, the refractive index, gain, carrier lifetime etc. of semiconductor waveguide are likely to change gradually, the phase bias or non-linear phase shift is likely to deviate from the optimum value, therefore deterioration in extinction ratio is likely to occur. However, the all-optical switches of the invention can improve such deterioration in extinction ratio.

ADVANTAGES OF THE INVENTION

According to the invention, the extinction ratio of all-optical switch can be improved. Especially, deterioration in extinction ratio to occur when the switch operation repetition frequency of all-optical switch is high, when the carrier life in semiconductor waveguide used in the all-optical switch is short, or when semiconductor grown at low temperature or inter-subband-transition semiconductor is used can be improved. Also, in operating the all-optical switch of the invention as a wavelength converter, the extinction ratio of output optical pulse can be improved. As a result, the switch operation with high repetition frequency can be performed in the all-optical switch.

Further, according to the invention, the optimum operation conditions of all-optical switch in operation can be kept for a long time.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An all-optical switch for outputting output light by transmitting/interrupting second input light with a second wavelength synchronizing with a first input light with a first wavelength, comprising:

an optical interferometer to which said first and second input lights are input and which comprises at least one non-linear semiconductor waveguide;

a supervisory laser light source which supplies supervisory light with a third wavelength to said optical interferometer; and a control device to which said supervisory light output from said optical interferometer is input as output supervisory light and which controls the phase bias of said interferometer according to said output supervisory light.

2. An all-optical switch, according to claim 1, wherein said control device comprises:

a spectrum component analyzer which analyzes the spectrum component of said output supervisory light to get a spectrum component analysis result; and a feedback control device which controls the phase bias of said interferometer according to the spectrum component analysis result.

3. An all-optical switch, according to claim 2, wherein:

said spectrum component analysis result indicates the wavelength component intensity of said output supervisory light.

4. An all-optical switch, according to claim 1, wherein:

said supervisory light comprises continuous light.

5. An all-optical switch, according to claim 4, wherein:

said first input light comprises a clock optical pulse sequence and said second input light comprises a signal optical pulse sequence.

6. An all-optical switch, according to claim 1, wherein:

said semiconductor waveguide comprises a semiconductor optical amplifier.

7. An all-optical switch, according to claim 1, wherein:

said semiconductor waveguide comprises an absorption type semiconductor waveguide.

8. An all-optical switch for outputting light by transmitting/interrupting second input light with a second wavelength synchronizing with first input light with a first wavelength, comprising:

an adjusting device which adjusts the optical intensity of said first input light to give adjusted input light;

an optical interferometer to which said first and second input lights are input and which comprises at least one non-linear semiconductor waveguide;

a supervisory laser light source which supplies supervisory light with a third wavelength to said optical interferometer; and a control device to which supervisory light output from said optical interferometer is input as output supervisory light and which controls said adjusting device according to said output supervisory light to adjust the optical intensity of said first input light.

9. An all-optical switch, according to claim 8, wherein:

said adjusting device comprises an attenuator, and said control device controls the attenuation amount of said attenuator according to the output supervisory light.

10. An all-optical switch, according to claim 8, wherein said control device comprises:

a spectrum component analyzer which analyzes the spectrum component of said output supervisory light to get a spectrum component analysis result; and a feedback control device which controls said adjusting device according to the spectrum component analysis result.

11. An all-optical switch, according to claim 10, wherein:

said spectrum component analysis result indicates the wavelength component intensity of said output supervisory light.

12. An all-optical switch, according to claim 2, wherein:

said supervisory light comprises continuous light.

13. An all-optical switch, according to claim 12, wherein:

said first input light comprises a clock optical pulse sequence and said second input light comprises a signal optical pulse sequence.

14. An all-optical switch, according to claim 8, wherein:

said semiconductor waveguide comprises a semiconductor optical amplifier.

15. An all-optical switch, according to claim 8, wherein:

said semiconductor waveguide comprises an absorption type semiconductor waveguide.

16. A wavelength converter for converting input light with a first wavelength into output light with a second wavelength, comprising:

an optical interferometer to which said input light and supervisory light with said second wavelength are input and which includes at least one non-linear semiconductor waveguide; and a control device to which supervisory light output from said optical interferometer is input as output supervisory light and which controls a phase adjuster injection current which, in turn, controls the phase bias of said interferometer according to said output supervisory light.

17. A wavelength converter, according to claim 16, wherein:

said supervisory light comprises continuous light.

18. A wavelength converter, according to claim 17, wherein:

said input light comprises a signal optical pulse sequence.

19. A wavelength converter, according to claim 16, wherein:

said semiconductor waveguide comprises a semiconductor optical amplifier.

20. A wavelength converter, according to claim 16, wherein:

said semiconductor waveguide comprises an absorption type semiconductor waveguide.

21. A wavelength converter for converting input light with a first wavelength into output light with a second wavelength, comprising:

an optical interferometer to which said input light and supervisory light with said second wavelength are input and which comprises at least one non-linear semiconductor waveguide; and a control device to which supervisory light output from said optical interferometer is input as output supervisory light and which controls the phase bias of said interferometer according to said output supervisory light, wherein said control device comprises a spectrum component analyzer which analyzes the spectrum component of said output supervisory light to get a spectrum component analysis result, and a feedback control device which controls the phase shift of said interferometer according to the spectrum component analysis result.

22. A wavelength converter, according to claim 21, wherein said spectrum component analysis result indicates the wavelength component intensity of said output supervisory light.

23. A wavelength converter for converting input light with a first wavelength into output light with a second wavelength, comprising:

an adjusting device which adjusts the optical intensity of said input light to give adjusted input light;

an optical interferometer to which said input light and supervisory light with said second wavelength are input and which comprises at least one non-linear semiconductor waveguide; and a control device to which supervisory light output from said optical interferometer is input as output supervisory light and which controls said adjusting device according to said output supervisory light to adjust the optical intensity of said input light, wherein said control device comprises one of an optical attenuator and a spectrum component analyzer.

24. A wavelength converter, according to claim 23, wherein said adjusting device comprises an attenuator, and said control device controls the attenuation amount of said attenuator according to the output supervisory light.

25. A wavelength converter, according to claim 23, wherein said control device comprises:

a spectrum component analyzer which analyzes the spectrum component of said output supervisory light to get a spectrum component analysis result; and a feedback control device which controls said adjusting device according to the spectrum component analysis result.

26. A wavelength converter, according to claim 25, wherein:

said spectrum component analysis result indicates the wavelength component intensity of said output supervisory light.

27. A wavelength converter, according to claim 23, wherein:

said supervisory light comprises continuous light.

28. A wavelength converter, according to claim 27, wherein:

said input light comprises a signal optical pulse sequence.

29. A wavelength converter, according to claim 23, wherein:

said semiconductor waveguide comprises a semiconductor optical amplifier.

30. A wavelength converter, according to claim 23, wherein:

said semiconductor waveguide comprises an absorption type semiconductor waveguide.

\* \* \* \* \*